(12) United States Patent
Miyai et al.

(10) Patent No.: US 9,076,981 B2
(45) Date of Patent: *Jul. 7, 2015

(54) PLANAR LIGHT EMITTING DEVICE HAVING STRUCTURE FOR BRIGHTNESS UNIFORMITY AND A COMPACT AREA OF NON-LIGHT EMITTING PART

(71) Applicant: PANASONIC CORPORATION, Osaka (JP)

(72) Inventors: Takao Miyai, Osaka (JP); Koki Fujihara, Niigata (JP); Yoshikazu Kuzuoka, Osaka (JP); Shingo Houzumi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/102,233

(22) Filed: Dec. 10, 2013

(65) Prior Publication Data

US 2014/0097424 A1 Apr. 10, 2014

Related U.S. Application Data

(63) Continuation of application No. 13/203,477, filed as application No. PCT/JP2010/052983 on Feb. 25, 2010, now Pat. No. 8,648,382.

(30) Foreign Application Priority Data

Feb. 26, 2009 (JP) ................................. 2009-044274

(51) Int. Cl.
*H01L 33/00* (2010.01)
*H01L 21/00* (2006.01)
(Continued)

(52) U.S. Cl.
CPC ........ *H01L 51/5203* (2013.01); *H01L 51/5212* (2013.01); *H01L 51/5228* (2013.01);
(Continued)

(58) Field of Classification Search
CPC .................. H01L 51/5228; H01L 2251/5361; H01L 51/5203; H01L 51/5212; H01L 27/329; H01L 27/3279

USPC .......... 257/99, 40, 98, 100, E33.064; 438/22, 438/27; 313/506
See application file for complete search history.

(56) References Cited

U.S. PATENT DOCUMENTS

| 5,652,067 | A | 7/1997 | Ito et al. |
| 6,784,463 | B2 | 8/2004 | Camras et al. |

(Continued)

FOREIGN PATENT DOCUMENTS

| EP | 1 679 939 A2 | 7/2006 |
| JP | 6-96858 A | 4/1994 |

(Continued)

OTHER PUBLICATIONS

Extended European Search Report dated Feb. 13, 2013 issued in corresponding European patent Application No. 10746271.5.

(Continued)

*Primary Examiner* — Long K Tran
*Assistant Examiner* — Dzung Tran
(74) *Attorney, Agent, or Firm* — McDermott Will & Emery LLP

(57) ABSTRACT

Planar light emitting device includes: anode and cathode feeding parts formed on first surface side of transparent substrate and electrically connected to quadrilateral planar anode and cathode, respectively; quadrilateral frame shaped anode auxiliary electrode formed at the whole circumference of surface of the planar anode; anode feeding auxiliary electrode integrally and continuously formed to the auxiliary electrode and laminated on anode feeding part. Two distances between predetermined two parallel sides of four sides of a light emitting part and outer circumferential edges of the transparent substrate on sides adjacent to the two parallel sides, respectively are smaller than two distances between the other two parallel sides and the outer circumferential edges of the transparent substrate on sides adjacent to the other two parallel sides, respectively.

22 Claims, 19 Drawing Sheets

(51) Int. Cl.

| | |
|---|---|
| *H01L 21/44* | (2006.01) |
| *H01J 1/62* | (2006.01) |
| *H01L 51/52* | (2006.01) |
| *H05B 33/04* | (2006.01) |
| *H05B 33/06* | (2006.01) |
| *H05B 33/26* | (2006.01) |
| *H01L 27/32* | (2006.01) |

(52) U.S. Cl.
CPC ........ *H01L2251/5361* (2013.01); *H05B 33/04* (2013.01); *H05B 33/06* (2013.01); *H05B 33/26* (2013.01); *H01L 27/3279* (2013.01); *H01L 27/329* (2013.01)

(56) References Cited

U.S. PATENT DOCUMENTS

| | | | |
|---|---|---|---|
| 6,867,539 B1 * | 3/2005 | McCormick et al. ......... 313/504 | |
| 7,192,658 B2 | 3/2007 | Albrecht et al. | |
| 7,342,356 B2 | 3/2008 | McCormick et al. | |
| 7,521,861 B2 | 4/2009 | Kawauchi et al. | |
| 7,692,273 B2 | 4/2010 | Nakane et al. | |
| 7,709,355 B2 | 5/2010 | Nakane et al. | |
| 7,956,532 B2 | 6/2011 | Nakamura | |
| 2005/0116658 A1 * | 6/2005 | Kato ........................ 315/169.3 | |
| 2005/0140279 A1 * | 6/2005 | Park .............................. 313/504 | |
| 2005/0200270 A1 * | 9/2005 | Kwak et al. .................... 313/502 | |
| 2005/0231107 A1 | 10/2005 | Yamazaki et al. | |
| 2005/0236956 A1 | 10/2005 | Chung et al. | |
| 2005/0248935 A1 | 11/2005 | Strip et al. | |
| 2006/0113903 A1 | 6/2006 | Kim | |
| 2006/0214157 A1 | 9/2006 | Kawauchi et al. | |
| 2006/0270304 A1 | 11/2006 | Aita | |
| 2006/0284202 A1 | 12/2006 | Nakane et al. | |
| 2006/0292955 A1 | 12/2006 | Kang et al. | |
| 2007/0013299 A1 * | 1/2007 | Hamada et al. ............... 313/505 | |
| 2007/0170838 A1 | 7/2007 | Harada et al. | |
| 2007/0170851 A1 * | 7/2007 | Yaegashi ...................... 313/506 | |
| 2008/0220684 A1 | 9/2008 | Nakane et al. | |
| 2008/0265783 A1 | 10/2008 | Nakamura | |
| 2010/0000603 A1 | 1/2010 | Tsuzuki et al. | |

FOREIGN PATENT DOCUMENTS

| | | |
|---|---|---|
| JP | 2000-100558 A | 4/2000 |
| JP | 2000-208056 A | 7/2000 |
| JP | 2006-062344 A | 3/2006 |
| JP | 2006-156403 A | 6/2006 |
| JP | 2006-202717 A | 8/2006 |
| JP | 2006-251193 A | 9/2006 |
| JP | 2006-252866 A | 9/2006 |
| JP | 2006-253302 A | 9/2006 |
| JP | 2006-330185 A | 12/2006 |
| JP | 2007-26971 A | 2/2007 |
| JP | 2007-194115 A | 8/2007 |
| JP | 2008-77855 A | 4/2008 |
| JP | 2008-117588 A | 5/2008 |
| JP | 2008-123882 A | 5/2008 |
| JP | 2008-258317 A | 10/2008 |
| WO | 2008/102867 A1 | 8/2008 |

OTHER PUBLICATIONS

International Search Report for the Application No. PCT/JP2010/052983 mailed Apr. 6, 2010.
Office Action issued in U.S. Appl. No. 13/203,477 mailed Nov. 5, 2012.
Final Office Action issued in U.S. Appl. No. 13/203,477 mailed Apr. 11, 2013.
Advisory Action issued in U.S. Appl. No. 13/203,477 mailed Jun. 14, 2013.
Notice of Allowance issued in U.S. Appl. No. 13/203,477 mailed Sep. 16, 2013.

* cited by examiner

PLANAR LIGHT EMITTING DEVICE HAVING STRUCTURE FOR BRIGHTNESS UNIFORMITY AND A COMPACT AREA OF NON-LIGHT EMITTING PART

CROSS REFERENCE TO RELATED APPLICATIONS

This application is a Continuation of U.S. Patent Application Ser. No. 13/203,477, filed Aug. 25, 2011, which is based on International Application No. PCT /JP2010/052983, filed Feb. 25, 2010, which in turn claims priority of Japanese Patent Application No. 2009-044274, filed on Feb. 26, 2009, the entire contents of each of which are hereby incorporated by reference.

TECHNICAL FIELD

The invention relates generally to planar light emitting devices and, more particularly, to a planar light emitting device comprising an organic EL element.

BACKGROUND ART

In this kind of planar light emitting devices, a transparent conductive film can be used as a planar anode, and a metal membrane can be used as a planar cathode. In order to activate such a device at high brightness, it is necessary to supply the device with a larger electric current. However, the sheet resistance of the planar anode is higher than that of the planar cathode, and therefore an electric potential gradient becomes large in the planar anode, and a large voltage is applied to a light emitting layer between the planar anode and the planar cathode. As a result, the device possesses a large dispersion in brightness.

This problem can be solved with, for example, an organic EL element (an organic electroluminescence device) disclosed in Japanese Patent Application Publication Number P2008-123882A published on May 29, 2008. This element is composed of a pair of opposite electrodes and an organic EL layer which includes at least an organic emitting layer and intervenes between the electrodes.

Specifically, a transparent electrode is formed on an insulation substrate with translucency, and a non-luminous insulation layer arranged in a pattern is formed in a required region of a surface of the transparent electrode. An organic EL layer containing organic light emitting material is then formed on the transparent electrode and the non-luminous insulation layer to coat them. An opposite electrode opposed to the transparent electrode is then formed on the organic EL layer. The whole light emitting part is then airtight sealed with a seal member made of glass or stainless steel.

Thus, by using the non-luminous insulation layer, when the device is activated under a drive condition by which average brightness becomes 1000 $cd/m^2$, brightness uniformity is reduced.

However, the area expansion of the light emitting part is limited due to increase of the area of the non-light emitting part, because the transparent electrode is connected to a power source through an electrode terminal located at an opposite edge of the insulation substrate with translucency, while the opposite electrode is connected to the power source through an electrode terminal located at another opposite edge of the insulation substrate with translucency. If a plurality of organic EL elements is arranged, a distance between adjacent light emitting parts becomes large, thereby causing disfigurement.

DISCLOSURE OF THE INVENTION

It is an object of the present invention to reduce brightness uniformity and to reduce the area of a non-light emitting part.

A planar light emitting device of the present invention comprises a transparent substrate that is quadrilateral in plan view; and an organic EL element formed on a first surface side of the transparent substrate. The organic EL element comprises: a planar anode comprising a transparent conductive film formed on the first surface side of the transparent substrate, said anode being quadrilateral in plan view; an organic layer which is formed on the opposite side of the transparent substrate in the planar anode and comprises at least a light emitting layer, said organic layer being quadrilateral in plan view; a planar cathode which is formed on the opposite side of the planar anode in the organic layer and is opposed to the planar anode, said cathode being quadrilateral in plan view; an anode feeding part which is formed on the first surface side of the transparent substrate and electrically connected to the planar anode; a cathode feeding part which is formed on the first surface side of the transparent substrate and electrically connected to the planar cathode; an anode auxiliary electrode which is formed at the whole circumference of the opposite surface of the transparent substrate in the planar anode and electrically connected to the planar anode, said anode auxiliary electrode being in the shape of a quadrilateral frame; and an anode feeding auxiliary electrode which is integrally and continuously formed to the anode auxiliary electrode and laminated on the anode feeding part. A light emitting part is formed of a region where the only organic layer intervenes between the planar anode and the planar cathode. The plane shape of the light emitting part is quadrilateral. A distance (hereinafter referred to as "a first distance") between predetermined two parallel sides of the four sides of the light emitting part and the peripheral border of the transparent substrate is smaller than a distance (hereinafter referred to as "a second distance") between the other two parallel sides and the peripheral border of the transparent substrate. While the cathode feeding part and the anode feeding part are located along said other two parallel sides of the light emitting part in plan view, the anode feeding part is located at each side, in a width direction, of the cathode feeding part.

In this invention, the anode auxiliary electrode and the anode feeding auxiliary electrode are provided, and accordingly it is possible to reduce brightness uniformity caused by potential gradient of the planar anode comprising the transparent conductive film. Moreover, the first distance is smaller than the second distance, the cathode and anode feeding parts are located along said other two parallel sides of the light emitting part in plan view, and the anode feeding part is located at each side, in a width direction, of the cathode feeding part. Accordingly, brightness uniformity and the area of non-light emitting part can be reduced.

In an embodiment, the planar light emitting device comprises a cathode feeding auxiliary electrode which is laminated on the cathode feeding part and electrically connected to the cathode feeding part. In this embodiment, it is possible to reduce contact resistance with an external conductor and dispersion of contact resistance and to improve luminance efficiency.

In an embodiment, the anode feeding part and the cathode feeding part are the same in thickness and formed of the same material, and the anode feeding auxiliary electrode and the cathode feeding auxiliary electrode are the same in thickness and formed of the same material. In addition, an anode external electrode is composed of the anode feeding part and the anode feeding auxiliary electrode, while a cathode external electrode is composed of the cathode feeding part and the cathode feeding auxiliary electrode. An overall width of the anode external electrode and an overall width of the cathode external electrode are set to the same value. In this embodiment, it is possible to increase an electric current supplied to the organic EL element and to improve luminance efficiency in comparison with the case that the overall width of the anode external electrode is different from the overall width of the cathode external electrode.

In an embodiment, the planar light emitting device comprises chamfers formed between each side edge, in a width direction, of the anode feeding auxiliary electrode and the outer circumferential edge of the anode auxiliary electrode. In this embodiment, it is possible to reduce electric field concentration and brightness uniformity in comparison with the case that any chamfers are not formed between each side edge, in a width direction, of the anode feeding auxiliary electrode and the outer circumferential edge of the anode auxiliary electrode.

In an embodiment, the planar light emitting device comprises: a wiring which is integrally and continuously extended from the planar cathode to electrically connect between the planar cathode and the cathode feeding part; and chamfers formed between each side edge, in a width direction, of the wiring and the outer circumferential edge of the planar cathode. In this embodiment, it is possible to reduce electric field concentration and brightness uniformity in comparison with the case that any chamfers are not formed between each side edge, in a lateral direction, of the wiring and the outer circumferential edge of the planar cathode.

In an embodiment, the planar light emitting device of any one of claims 1-5, comprising chamfers formed between adjacent inner side edges of the anode auxiliary electrode. In this embodiment, it is possible to reduce electric field concentration in corners of the anode auxiliary electrode, to prevent an excessive electric current from flowing locally, to reduce brightness uniformity and to prevent life shortening.

In an embodiment, the planar light emitting device comprises a sealing member fixed to said first surface side of the transparent substrate by nonconductive adhesive comprising sealing material so as to cover the light emitting part of the organic EL element. The sealing member comprises a metal foil. In this embodiment, the sealing member is provided, and thereby humidity resistance can be improved. Since the sealing member comprises a metal foil, heat generated at the light emitting part of the organic EL element can be efficiently radiated in comparison with the sealing member of a barrier film.

In an embodiment, the planar light emitting device comprises a chamfer formed between a side edge and the surface of the transparent substrate side in the metal foil. In this embodiment, it is possible to prevent a short circuit by contact between the metal foil and the organic EL element caused by burrs occurring when cutting a metal foil into a predetermined size.

In an embodiment, the sealing material contains spherical fillers 20 μm or more in grain diameter. In this embodiment, spherical fillers 20 μm or more in grain diameter intervene between the sealing member and the organic EL element, and accordingly it is possible to prevent occurrence of a short circuit by contact between the metal foil forming the sealing member and the organic EL element while shortening the distance between the sealing member and the organic EL element.

In an embodiment, the planar light emitting device comprises a black oxidation surface formed on the opposite surface side of the transparent substrate in the metal foil. In this embodiment, the emissivity of the sealing member is increased to improve heat radiation performance, and heating up of the organic EL element can be restrained. An electric current supplied to the organic EL element is increased and brightness can be increased.

In an embodiment, the planar light emitting device comprises a thermal radiation layer which is fixed to the opposite surface side of the transparent substrate in the metal foil and formed of material with higher emissivity than the metal foil. In this embodiment, the emissivity of the sealing member is increased to improve heat radiation performance, and heating up of the organic EL element can be restrained. An electric current supplied to the organic EL element is increased and brightness can be increased.

BRIEF DESCRIPTION OF THE DRAWINGS

Preferred embodiments of the invention will now be described in further details. Other features and advantages of the present invention will become better understood with regard to the following detailed description and accompanying drawings where:

FIG. 1 shows a planar light emitting device in accordance with a first embodiment of the present invention.

FIG. 16 shows a simulation result on a first practical example of the planar light emitting device.

FIG. 17 shows a simulation result on a first comparative example with the planar light emitting device.

FIG. 18 shows a simulation result on a second practical example of the planar light emitting device.

FIG. 19 shows a simulation result on a second comparative example with the planar light emitting device.

FIG. 20 shows a simulation result on a third practical example of the planar light emitting device.

FIG. 21 shows a simulation result on a third comparative example with the planar light emitting device.

BEST MODE FOR CARRYING OUT THE INVENTION

First Embodiment

Figure 1A:
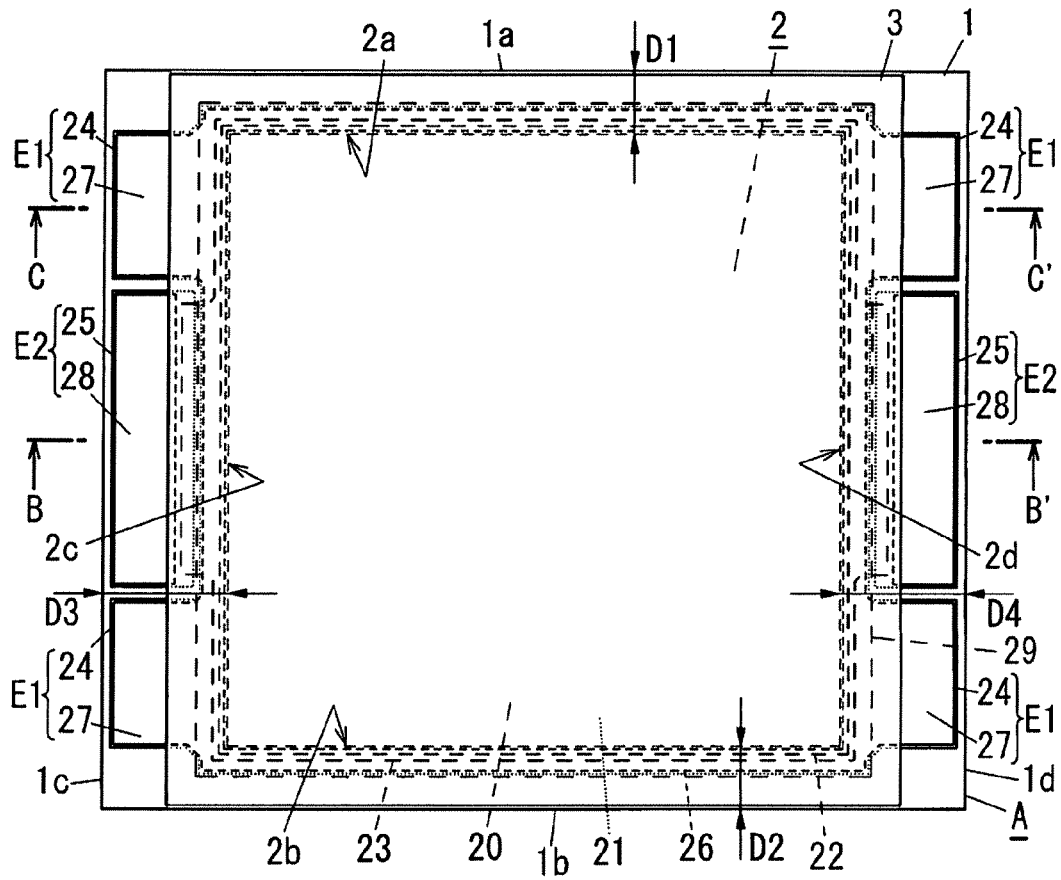
FIGS. 1A, 1B and 1C are a back view, a schematic cross sectional view taken along line B-B' of FIG. 1A and a schematic cross sectional view taken along line C-C' of FIG. 1A, respectively.

As shown in FIGS. 1-4, a planar light emitting device A of the present embodiment includes: a transparent substrate 1 that is quadrilateral in plan view (rectangular in plan view in the illustration example); an organic EL element 2 formed on a first surface side of the transparent substrate 1; and a sealing member 3 that is quadrilateral in plan view (square in plan view in the illustration example). This member is fixed to the first surface side of the transparent substrate 1 by nonconductive adhesive comprising sealing material (e.g., epoxy resin containing spherical silica having grain diameter of 30 μm) so as to cover a light emitting part 20, that is quadrilateral in plan view (square in plan view in the illustration example), in the organic EL element 2. A sealing part 4 comprising the non-conductive adhesive is formed between the sealing member 3 and the light emitting part 20. The quadrilateral includes rectangular and square.

In the planar light emitting device A, the other surface of the transparent substrate 1 is used as a light output surface (a light-emitting face). A glass substrate is used as the transparent substrate 1. Besides the glass substrate, a transparent resin film substrate may be used as the transparent substrate 1.

Figure 8:
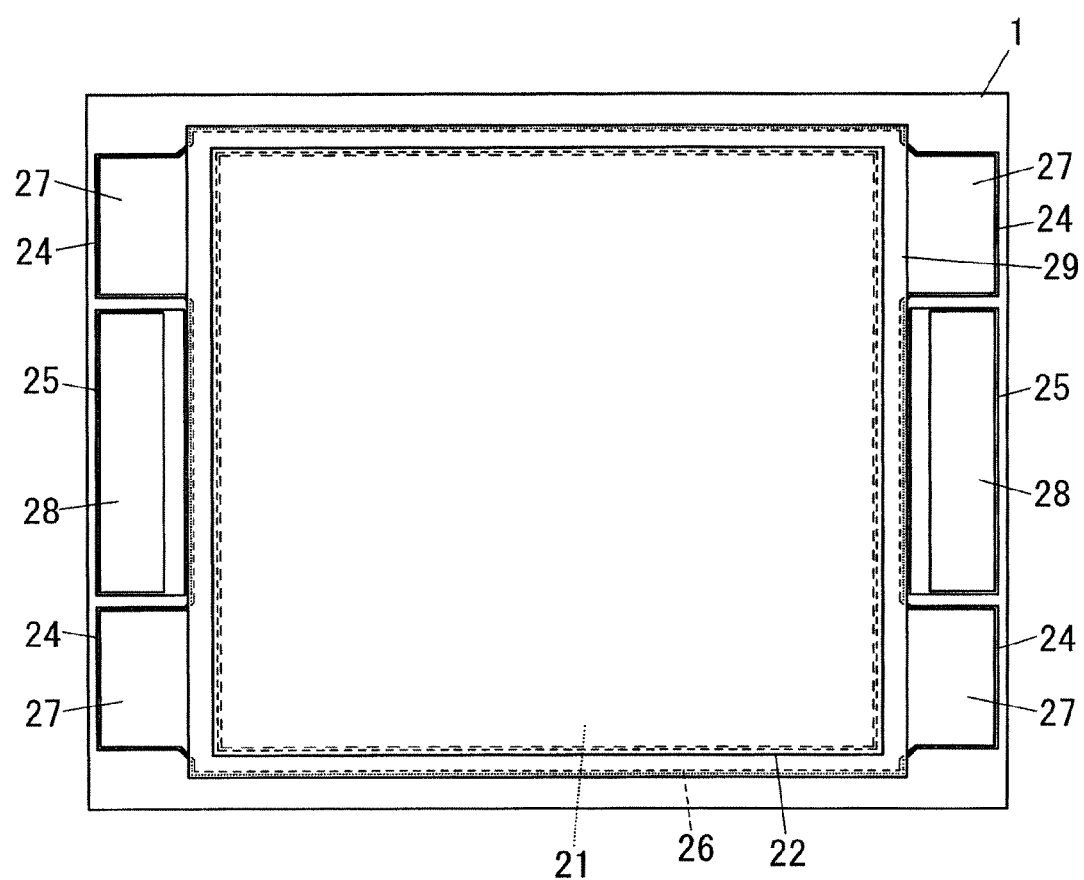
FIG. 8 is a main process plan view for describing a production method of the planar light emitting device.
Figure 9:
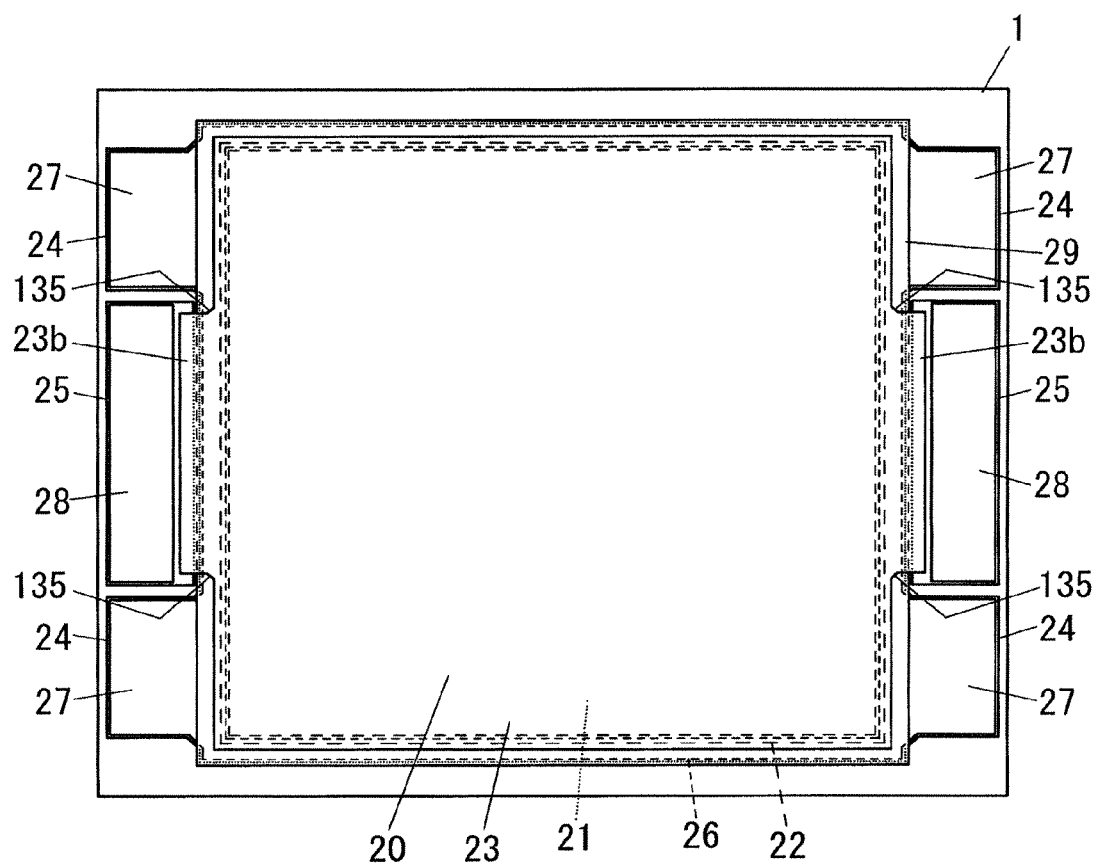
FIG. 9 is a main process plan view for describing a production method of the planar light emitting device.

The organic EL element 2 includes: a planar anode 21 that is quadrilateral in plan view (square in plan view in the illustration example) and comprises a transparent conductive film (e.g., ITO film, IZO film or the like) formed on the first surface side of the transparent substrate 1 (see FIG. 5); an organic layer 22 that is quadrilateral in plan view (square in plan view in the illustration example) and is formed on the opposite side of the transparent substrate 1 side in the planar anode 21 and includes at least a light emitting layer (see FIG. 8); a planar cathode 23 that is quadrilateral in plan view (square in plan view in the illustration example) and is formed on the opposite side of the planar anode 21 side in the organic layer 22 to be opposed to the planar anode 21 (see FIG. 9); anode feeding parts 24, formed on the first surface side of the transparent substrate 1 at each of both ends, in a longitudinal direction, of the transparent substrate 1, each of which is formed of a transparent conductive film (e.g., ITO film, IZO film or the like) electrically connected to the planar anode 21 (see FIG. 5); and cathode feeding parts 25, formed on the first surface side of the transparent substrate 1 at both ends, in a longitudinal direction, of the transparent substrate 1, each of which is formed of a transparent conductive film (e.g., ITO film, IZO film or the like) electrically connected to the planar cathode 23 (see FIG. 9).

Figure 1B:
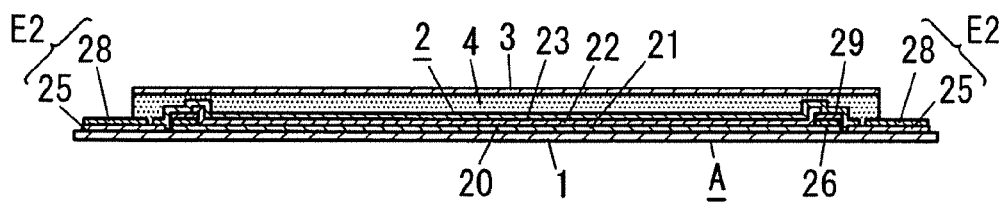
Figure 1C:
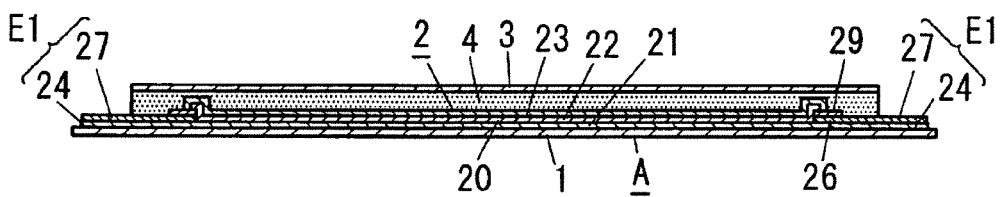
Figure 2:
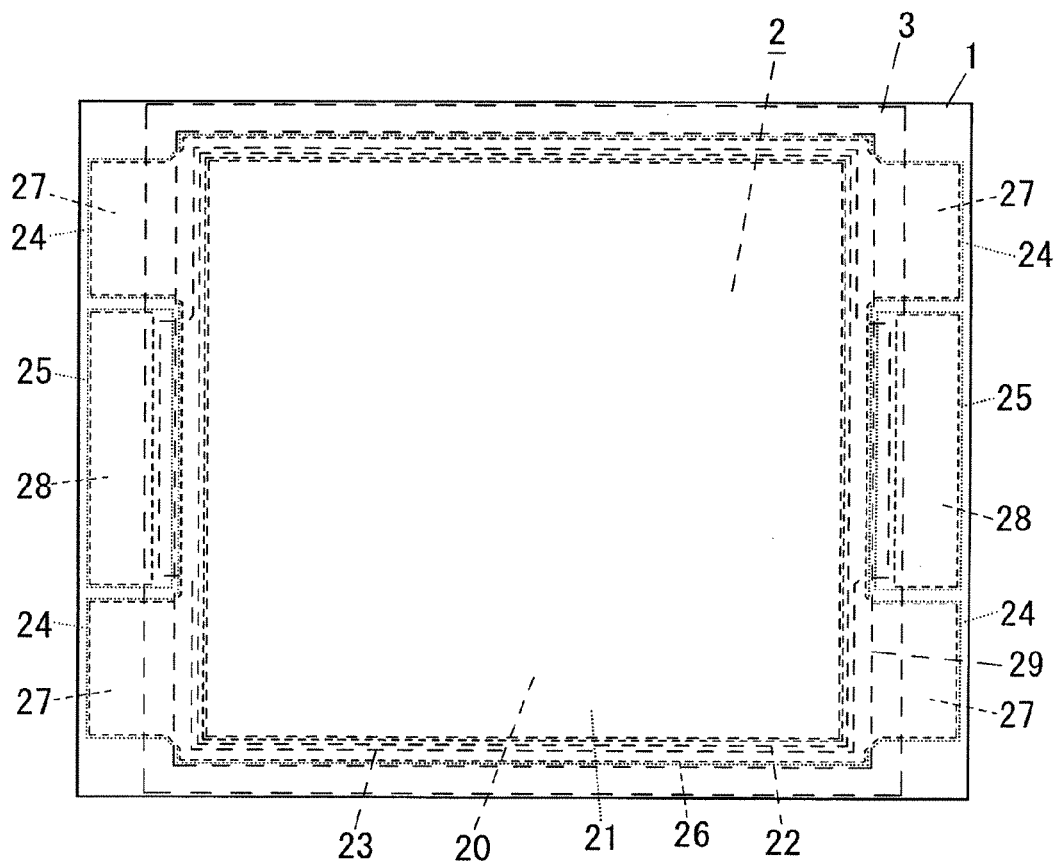
FIG. 2 is a front view of the planar light emitting device.
Figure 3:
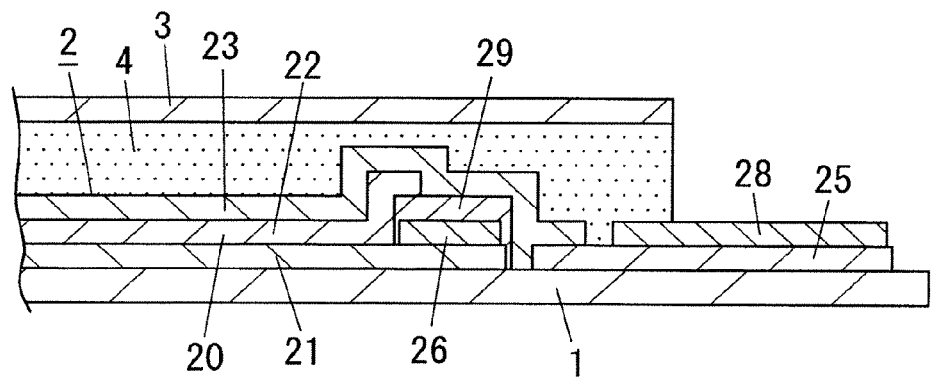
FIG. 3 is an enlarged view of an essential part of FIG. 1B.
Figure 4:
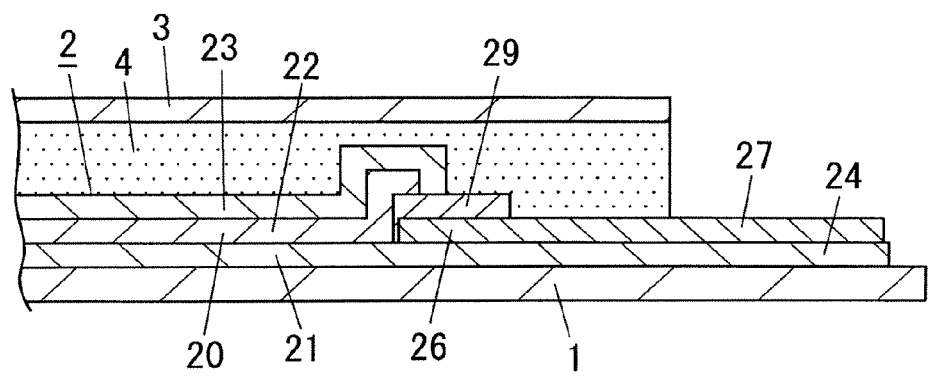
FIG. 4 is an enlarged view of an essential part of FIG. 1C.

In the organic EL element 2, two anode feeding parts 24, 24 are spaced in a lateral direction of the transparent substrate 1 at each of both ends, in the longitudinal direction, of the transparent substrate 1. One cathode feeding part 25 is located between two adjacent anode feeding parts 24, 24 in a lateral direction of the transparent substrate 1. As shown in FIGS. 1 and 9, two adjacent anode feeding parts 24, 24 in a lateral direction of the transparent substrate 1 is in the shape of a quadrilateral plane extended in a direction perpendicular to one edge along a lateral direction of the transparent substrate 1 in the planar anode 21 from both ends in a longitudinal direction of the one edge.

The organic EL element 2 is configured so that the light emitting layer in the organic layer 22 emits light when a direct voltage is applied across the planar anode 21 and the planar cathode 23. The organic layer 22 includes: the light emitting layer comprising organic molecular material from which light of desired emission color is obtained; a hole transport layer intervening between the light emitting layer and the planar anode 21; and an electron transport layer intervening between the light emitting layer and the cathode 23. Herein, the laminar structure of the organic layer 22 is not limited in particular. For example, if desired emission color of the organic layer 22 is white, three kinds of dopant pigments such as red, green and blue may be doped in the light emitting layer in order to employ the laminar structure composed of a hole transport layer, a light emitting layer and an electron transport layer. The laminar structure composed of a blue hole transport light emitting layer, a green electron transport light emitting layer and a red electron transport light emitting layer may be employed. The laminar structure composed of a hole transport layer, a blue electron transport light emitting layer, a green electron transport light emitting layer and a red electron transport light emitting layer may be employed. The transparent substrate 1 may contain one or more fluorescence substances excited by light from the light emitting layer of the organic layer 22 to emit long-wavelength light in comparison with the light from the light emitting layer. If the emission color of the light emitting layer is blue and the emission color of a fluorescence substance is yellow, white light can be obtained. The organic layer 22 may consist of only light emitting layer without hole and electron transport layers.

The planar cathode 23 comprises an Al film, but is not limited to the Al film. What is needed is that it is formed of metal having a small electric resistivity and a small work function in comparison with the transparent conductive film. For example, it may be formed of laminated films of an Mg film and an Ag film. The planar cathode 23 is electrically connected with a cathode feeding part 25 through a wiring 23b extended in a direction perpendicular to one edge along a lateral direction of the transparent substrate 1 in the planar cathode 23 from the central part in a longitudinal direction of the one edge (see FIG. 9). The planar cathode 23 and the wirings 23b are formed to have the same thickness by the same materials at the same time. Incidentally, the planar cathode 23 and the wirings 23b are sealed with the sealing part 4.

The organic EL element 2 includes: an anode auxiliary electrode 26, in the shape of a quadrilateral frame in plan view (in the shape of a square frame in plan view in the illustration example), which, in the first surface side of the transparent substrate 1, is formed at whole circumference of opposite surface of the transparent substrate 1 side in the planar anode 21 and is electrically connected to the planar anode 21; and a cathode feeding auxiliary electrode 28 which is layered on opposite side of the transparent substrate 1 side in the cathode feeding part 25 and is electrically connected with the cathode feeding part 25. Herein, the auxiliary electrodes 26 and 28 are each formed of laminated films of a Cr film and an Au film, and what is needed is that each of them is formed of material with smaller resistivity than the planar anode 21 and the cathode feeding part 25. For example, they may be each formed of laminated films of an MO film, an Al film and an MO film. The provided auxiliary electrodes 28 are layered on the cathode feeding parts 25 to be electrically connected to the cathode feeding part 25, thereby reducing contact resistance with an external conductor and dispersion of contact resistance, and improving luminance efficiency in comparison with electrical connection by contact between the cathode feeding part 25 and the external conductor.

The auxiliary electrode 26 is integrally and continuously formed with an anode feeding auxiliary electrode 27 which is layered on the anode feeding parts 24 to be electrically connected to the anode feeding parts 24. Therefore, the auxiliary electrode 27 is integrally layered on the anode feeding part 24 formed of a transparent conductive film and has low resistivity in comparison with the transparent conductive film, thereby reducing contact resistance with an external conductor, dispersion of contact resistance and voltage loss between the auxiliary electrode 26 and the anode feeding part 24 in comparison with electrical connection by contact between the anode feeding part 24 and the external conductor.

The planar anode 21, the anode feeding parts 24 and the cathode feeding parts 25 are formed to have the same thickness by the same transparent conductive material (e.g., ITO, IZO, etc.) at the same time. The auxiliary electrodes 27 and 28 are also formed to have the same thickness by the same materials. The overall width dimension of an anode external electrode E1 composed of an anode feeding part 24 and an auxiliary electrode 27 as well as the overall width dimension of a cathode external electrode E2 composed of a cathode feeding part 25 and an auxiliary electrode 28 are set to the same value. Therefore, it is possible to reduce electric current loss to increase an electric current flowing through the organic EL element 2 and also to improve luminance efficiency, in comparison with the case that the overall width dimension of an anode external electrode E1 is different from the overall width dimension of a cathode external electrode E2.

The organic EL element 2 is formed with an insulating film 29, in the shape of a quadrilateral frame in plan view (in the shape of a square frame in plan view in the illustration example), which covers the auxiliary electrode 26 and the edge of the planar anode 21 in the first surface side of the transparent substrate 1. The insulating film 29 prevents a short circuit of the auxiliary electrode 26 and the planar anode 21 with respect to the planar cathode 23. For example, polyimide, novolac resin, epoxy resin or the like may be used as material of the insulating film 29.

In the organic EL element 2, the light emitting part 20 is formed of the region where the only organic layer 22 intervenes between the planar anode 21 and the planar cathode 23. A plane shape of the light emitting part 20 is the same quadrilateral as an inner peripheral edge of the insulating film 29 (square in the illustration example). In the planar light emitting device A, a non-light emitting part is composed of parts except the light emitting part 20 of the organic EL element 2 in plan view.

In the embodiment, a plane size of the light emitting part 20 is appropriately set to 60 mm □. A center-to-center dimension of two anode feeding parts 24, 24 located at both sides, in a width direction, of a cathode feeding part 25 is appropriately set to 45 mm. The planar anode 21 is appropriately set in a range of approximately 110 nm-300 nm in thickness. The organic layer 22 is appropriately set in a range of approximately 150 nm-300 nm in thickness. The planar cathode 23 is appropriately set in a range of approximately 70 nm-100 nm in thickness. The insulating film 29 is appropriately set in a range of approximately 0.7 μm-1 μm in thickness. The frame-shaped auxiliary electrode 26 and the auxiliary electrodes 28 are appropriately set in a range of approximately 300 nm-600 nm in thickness. These numerical values are one example and not limited to in particular.

With reference to the width of the quadrilateral frame shaped auxiliary electrode 26, if it is widened, the impedance of the auxiliary electrode 26 is reduced and the in-plane dispersion of brightness of the light emitting part 20 is reduced. However, the area of the non-light emitting part is increased and luminous flux is reduced. In the embodiment, it is set in a range of approximately 1 mm-3 mm. The distance of the anode feeding part 24 and the cathode feeding part 25 from the peripheral border of the transparent substrate 1 is set to 0.2 mm, which is described later.

In the embodiment, metal foil made of copper foil is employed as the sealing member 3, and is vacuum laminated over large areas of the organic EL element 2 through the sealing part 4 on the first surface side of the transparent substrate 1. Preferably, electrolytic copper foil rather than rolled copper foil is used as the copper foil from the viewpoint of thermal conductivity and adhesive strength. In the planar light emitting device A of the embodiment, a plane size of the sealing member 3 is set to a larger size than the outer circumference of the insulating film 29. A part of circumference of the sealing member 3 is fixed to the transparent substrate 1 with nonconductive adhesive formed of the sealing material so that the planar anode 21 and the planar cathode 23 are unexposed. Thereby, humidity resistance can be raised. Exposed portions of the organic EL element 2 are only: the auxiliary electrodes 27; parts, uncovered by the auxiliary electrodes 27, of the anode feeding parts 24, (see FIG. 4); the auxiliary electrodes 28; and parts, uncovered by the auxiliary electrodes 28, of the cathode feeding parts 25 (see FIG. 3). In the embodiment, the sealing member 3 is approximately 0.1 mm-0.2 mm in thickness but is not limited to such a numeric number in particular. Besides copper foil, for example, aluminum foil, gold foil or the like may be employed as the metal foil of the sealing member 3.

In order to efficiently radiate the heat generated at the organic EL element 2 from the sealing member 3 side, it is desirable that the distance between the organic EL element 2 and the sealing member 3 should be short. However, surface roughness of electrolytic copper foil is approximately 10 μm as arithmetic average roughness Ra prescribed in JIS B 0601-1994. It is necessary to prevent outbreak of short circuit failure by contact between the sealing member 3 and electrode sections of the organic EL element 2 (auxiliary electrodes 27, anode feeding parts 24, auxiliary electrodes 28, cathode feeding parts 25, planar anode 21, planar cathode 23, etc.). The epoxy resin containing spherical fillers of 30 μm in grain diameter is used as the sealing material forming the aforementioned nonconductive adhesive. Preferably, spherical silica with excellent properties such as adherence property with epoxy resin, electrical insulation property and low moisture permeability is used as the fillers but it is not limited to the silica. For example, spherical alumina may be used.

Table 1 shows experiment results for investigating presence or absence of outbreak of short circuit failure by using sealing material comprising epoxy resin wherein grain diameter and contained amount of the filler comprising spherical silica are changed in various ways, as follows.

TABLE 1

| Grain Diameter of Filler [μm] | Contained Amount [Mass %] | Presence or Absence of Short Circuit |
|---|---|---|
| Unavailable | 0 | Presence |
| 5 | 0.3 | Presence |
| 10 | 0.3 | Presence |
| 15 | 0.3 | Presence |
| 20 | 0.3 | Presence |
| 20 | 3.0 | Presence |
| 20 | 6.0 | Absence |
| 30 | 3.0 | Absence |
| 30 | 6.0 | Absence |

It is found from Table 1 that outbreak of short failure circuit can be prevented if filler are 20 μm or more in grain diameter. Preferably, filler is set in a range from 30 μm to 40 μm in grain diameter, because there is a concern that characteristics of organic EL element 2 deteriorates due to increase of moisture penetration rate if filler is more than 40 μm in grain diameter.

Preferably, filler is set in a range from 3.0 to 6.0 mass % in contained amount. For example, filler more than 20 mass % in contained amount causes deterioration of adhesion strength between the transparent substrate 1 and the sealing member 3 comprising the electrolytic copper foil, and a high peeling rate of the sealing member 3 due to temperature cycle by repeatedly turning the organic EL element 2 on and off.

When an electrolytic copper foil with a plane size (a predetermined size) for the sealing member 3 is cut from an electrolytic copper foil with a plane size which can be divided into multiple members, burrs occur at the outer circumference of the electrolytic copper foil employed as the sealing member 3. Accordingly, a chamfer is formed between the surface and edge of the transparent substrate 1 side by removing the burrs. If the chamfer is formed, it is possible to surely prevent a short circuit between the sealing member 3 and the aforementioned electrode sections (auxiliary electrodes 27, anode feeding parts 24, auxiliary electrodes 28, cathode feeding parts 25, planar anode 21, planar cathode 23, etc.).

In the embodiment, a black oxidation treatment is provided for opposite surface side of the transparent substrate 1 side in the electrolytic copper foil of metal foil forming the sealing member 3 (black processed black oxidation surface). In comparison with the case that a black oxidation treatment is provided for the opposite surface side, the emissivity of the sealing member 3 is increased to improve heat radiation performance, and heating up of the organic EL element 2 can be restrained. Longer operating life can be obtained even if input power is increased to raise brightness. In an example, surface temperature of the transparent substrate 1 fell to approximately 3 degrees Celsius with 250 mA electric current supplied to the organic EL element 2 to activate the organic EL element 2 at high brightness (e.g., approximately 3000 cd/m$^2$ in average brightness). It is also possible to extend the life (brightness half life) when the organic EL element 2 is constantly supplied with 250 mA electric current and continuously activated at 3000 cd/m$^2$ in initial average brightness for a long time.

A thermal radiation layer may be formed by, for example, painting or the like on opposite surface side of the transparent substrate 1 side in metal foil forming the sealing member 3, wherein the thermal radiation layer comprises mediums (e.g., black or white acrylic resin, etc.) having higher emissivity than the metal foil. In this case, it is also possible to improve heat radiation performance by the high emissivity of the sealing member 3 and to restrain heating up of the organic EL element 2. Longer operating life can be obtained even if input power is increased to raise brightness. Corrosion resistance of the sealing member 3 can be also raised.

However, the sealing member 3 is not limited to metal foil. For example, a barrier film may be employed, but metal foil is more preferable from the viewpoint of heat radiation performance. In brief, the sealing member 3 is formed of metal foil, thereby efficiently radiating heat generated at the light emitting part 20 of the organic EL element 2 in comparison with the sealing member 3 of a barrier film.

A production method of the planar light emitting device A in the embodiment is described referring to FIGS. 5-10, as follows.

Figure 5:
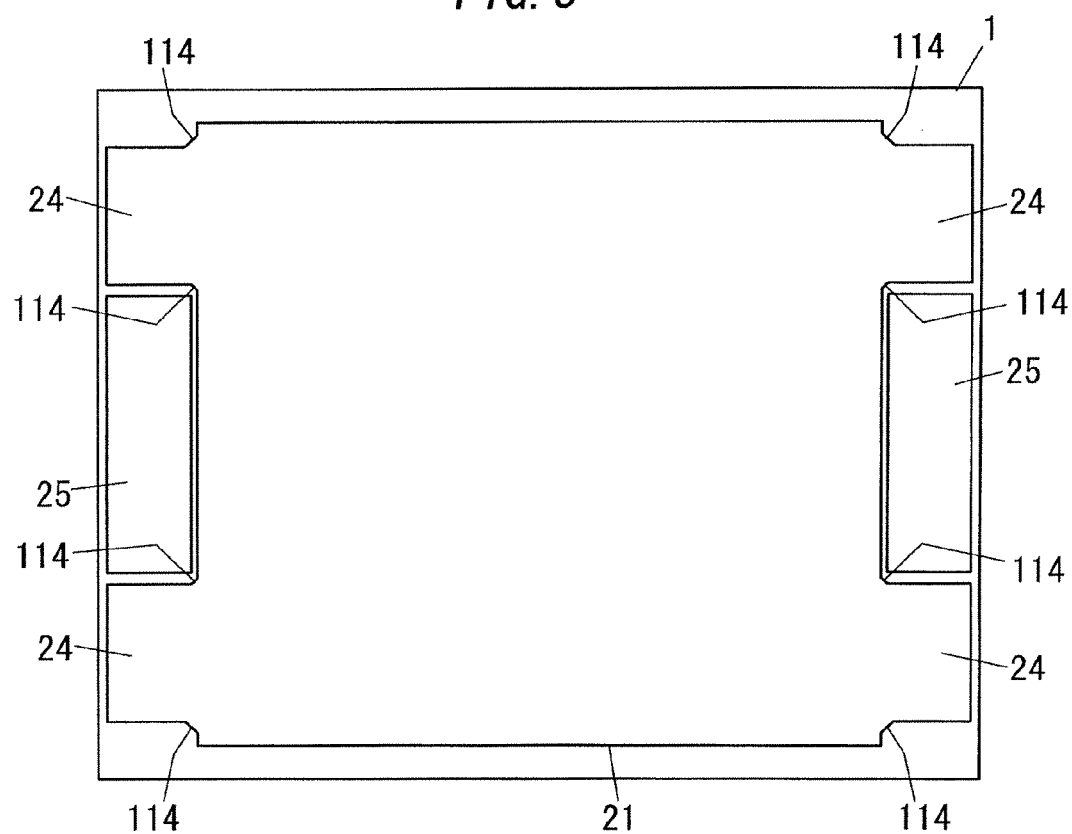
FIG. 5 is a main process plan view for describing a production method of the planar light emitting device.

First, a planar anode 21 of a transparent conductive film (e.g., ITO film, IZO film, etc.), anode feeding parts 24 and cathode feeding parts 25 are formed on a first surface side of a transparent substrate 1 of a glass substrate at the same time by using the vapor deposition method, sputtering or the like. Thereby, the structure shown in FIG. 5 is obtained.

Figure 6:
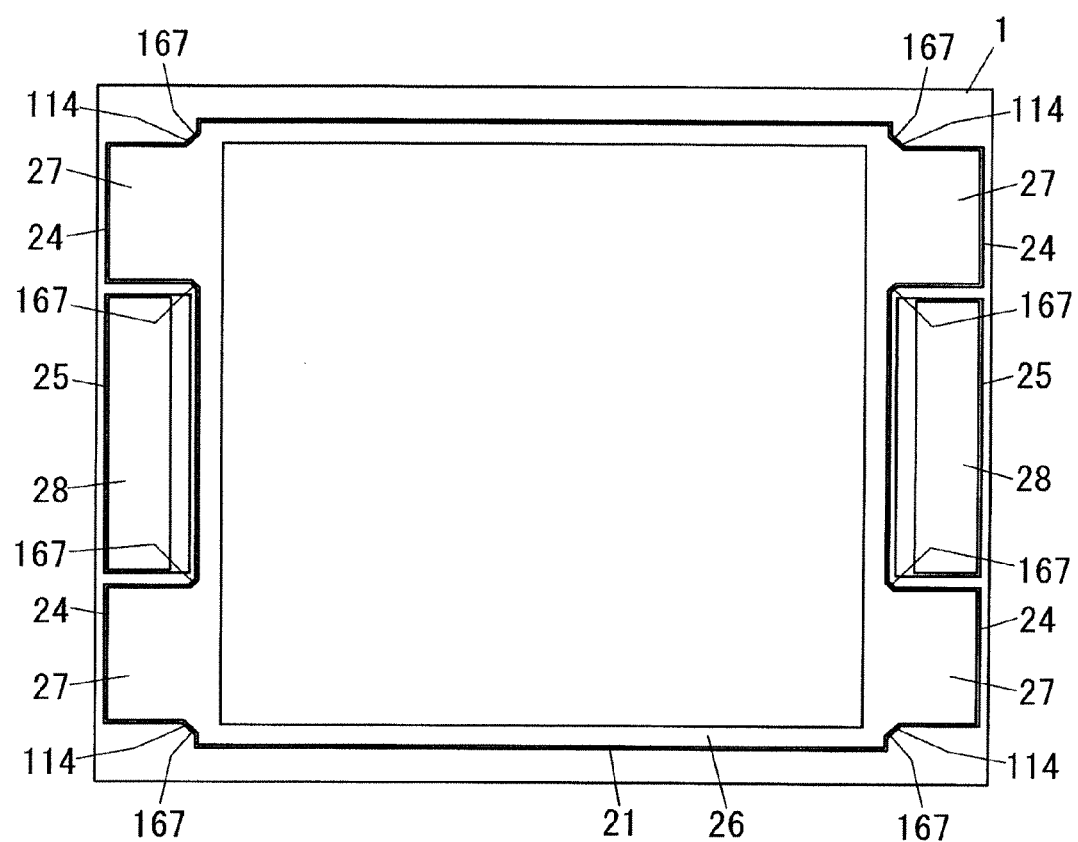
FIG. 6 is a main process plan view for describing a production method of the planar light emitting device.

Next, the first surface side of the transparent substrate 1 is at the same time formed with an auxiliary electrode 26, auxiliary electrodes 27 and auxiliary electrodes 28, each of which is formed of a low resistance conductive layer (e.g., laminated films of a Cr film and an Au film, laminated films of an MO film, an Al film and an MO film, etc.), by using the vapor deposition method, sputtering or the like. Thereby, the structure shown in FIG. 6 is obtained.

Figure 7:
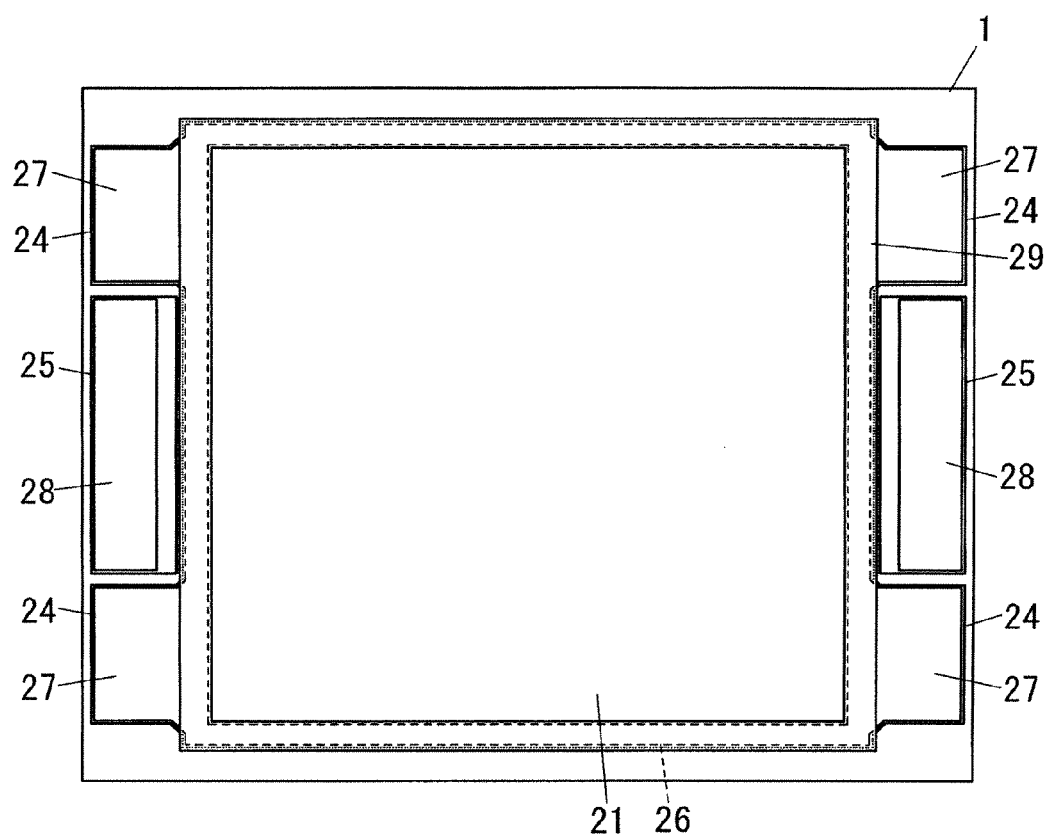
FIG. 7 is a main process plan view for describing a production method of the planar light emitting device.

An insulating film 29 comprising polyimide is then formed on the first surface side of the transparent substrate 1. Thereby, the structure shown in FIG. 7 is obtained.

An organic layer 22 is subsequently formed on the first surface side of the transparent substrate 1 by, for example, the vapor deposition method or the like. Thereby, the structure shown in FIG. 8 is obtained. However, a formation method of the organic layer 22 is not limited to the vapor deposition method. For example, a coating method or the like may be appropriately selected depending on organic molecules materials.

A planar cathode 23 and wirings 23b are then formed on the first surface side of the transparent substrate 1 by using the vapor deposition method, sputtering or the like. Thereby, the structure shown in FIG. 9 is then obtained.

Figure 10:
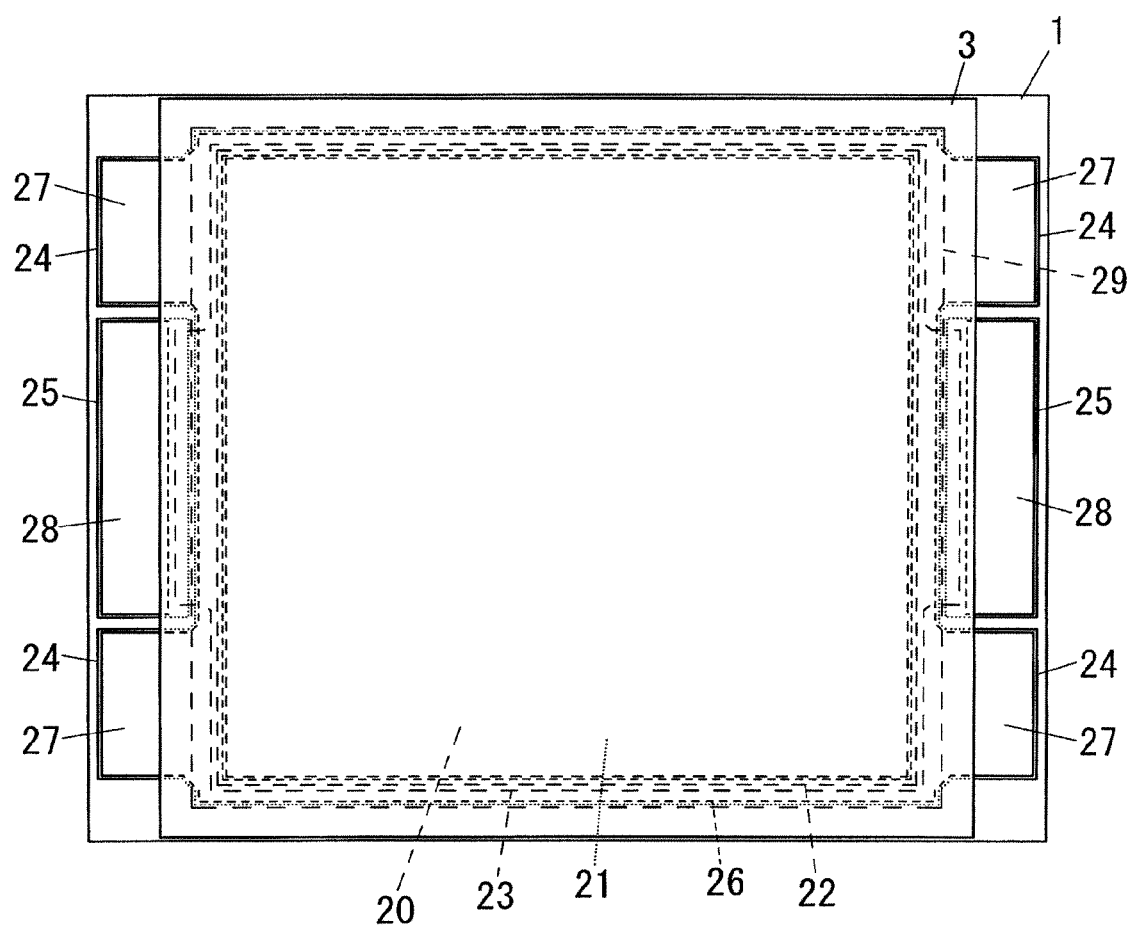
FIG. 10 is a main process plan view for describing a production method of the planar light emitting device.

A sealing member 3 is subsequently bonded to the first surface side of the transparent substrate 1 by vacuum laminating. Thereby, a planar light emitting device A having the structure shown in FIG. 10 is obtained.

Figure 11:
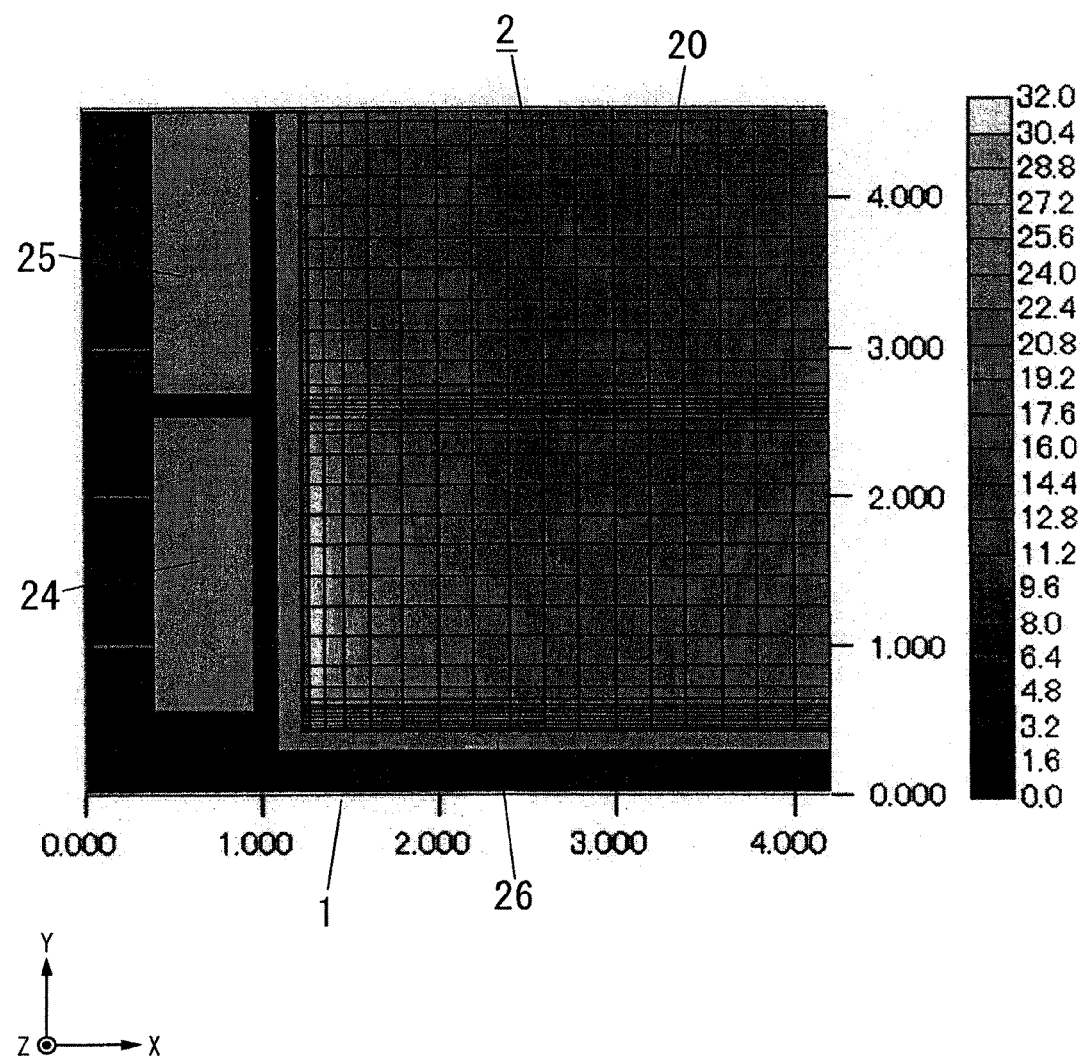
FIG. 11 is a brightness distribution map by a simulation of the planar light emitting device.
Figure 12:
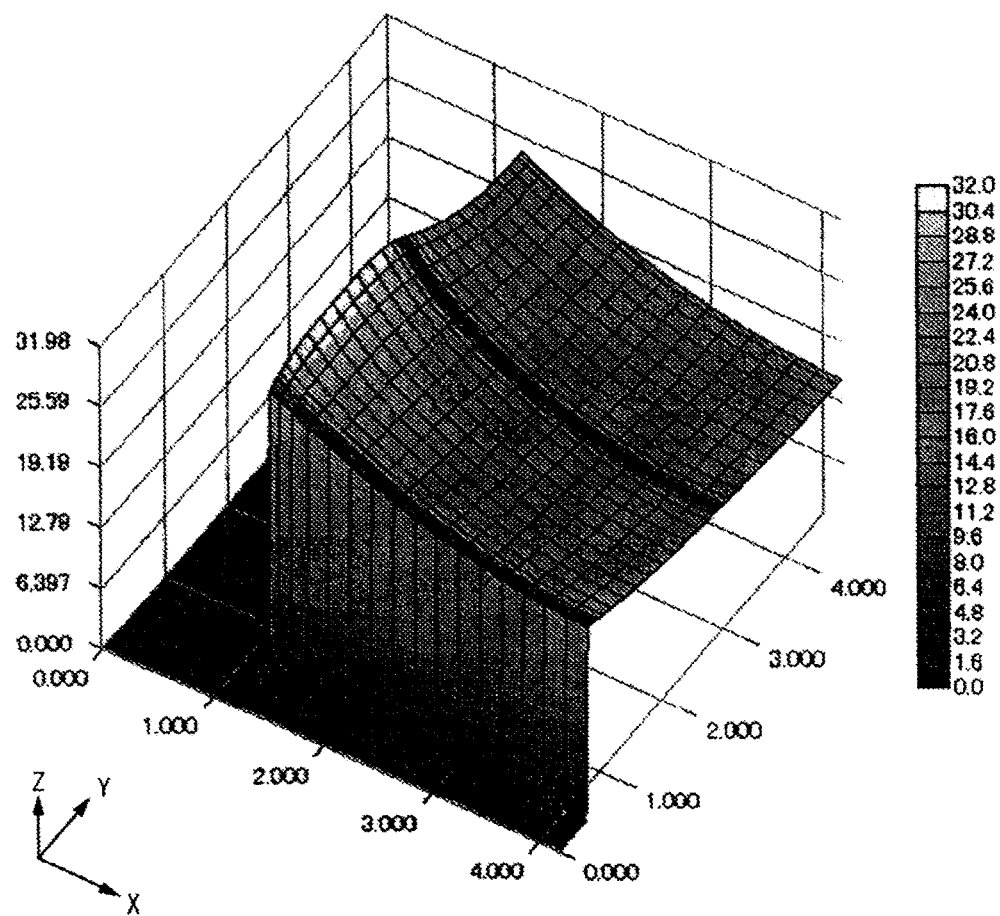
FIG. 12 is a brightness distribution map by a simulation of the planar light emitting device.

FIGS. 11 and 12 show simulation results about current-density distribution in generally proportional to brightness, wherein in order to simulate in-plane distribution of brightness of the light emitting part 20 in the planar light emitting device A, the planar anode 21 was set to an ITO film that is 300 nm in thickness, the planar cathode 23 was set to an Al film that is 80 nm in thickness, the organic layer 22 was set to 150 nm in thickness, and the organic EL element 2 was supplied with an electric current of 250 mA. FIG. 11 shows distribution of current-density (unit: mA/cm$^2$) in an XY plane, where the origin is a corner of the transparent substrate 1 in plan view, the x-axis direction is a longitudinal direction of the transparent substrate 1 (unit: cm), the y-axis direction is a lateral direction of the transparent substrate 1 (unit: cm), and the z-axis direction is a thickness direction of transparent substrate 1. In FIG. 12, the origin is a corner of the transparent substrate 1 in plan view, the x-axis direction is a longitudinal direction of the transparent substrate 1 (unit: cm), the y-axis direction is a lateral direction of the transparent substrate 1 (unit: cm), and the z-axis direction is current-density amplitude (unit: mA/cm$^2$).

From FIGS. 11 and 12, it was ascertained that in-plane dispersion of brightness of the light emitting part 20 was controlled to around +−15% in high intensity lighting of 3000 cd/m$^2$ in average brightness (3 times of 1000 cd/m$^2$ which is brightness of prior art).

Figure 13:
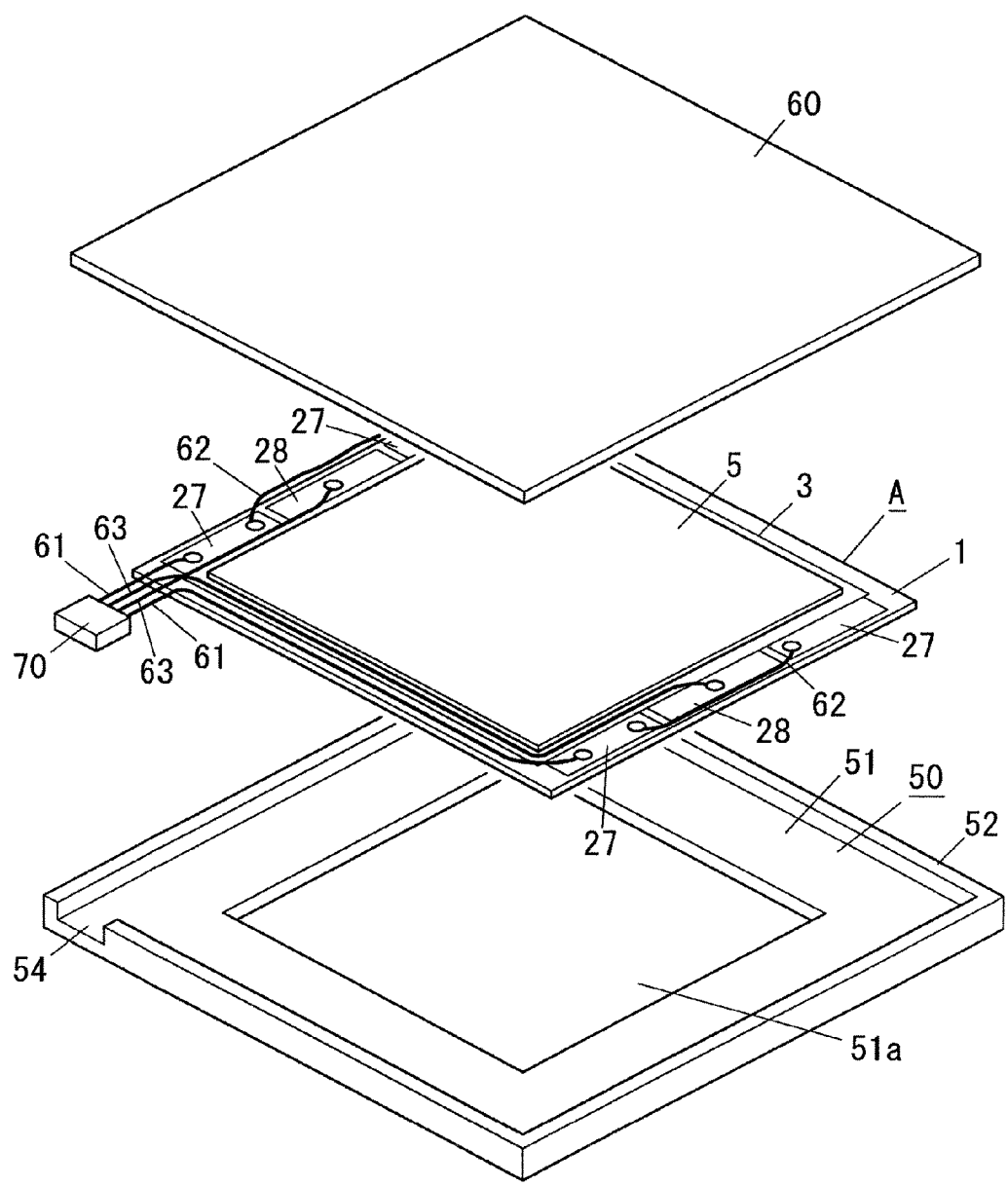
FIG. 13 is a schematic exploded perspective view of lighting equipment using the planar light emitting device.
Figure 14:
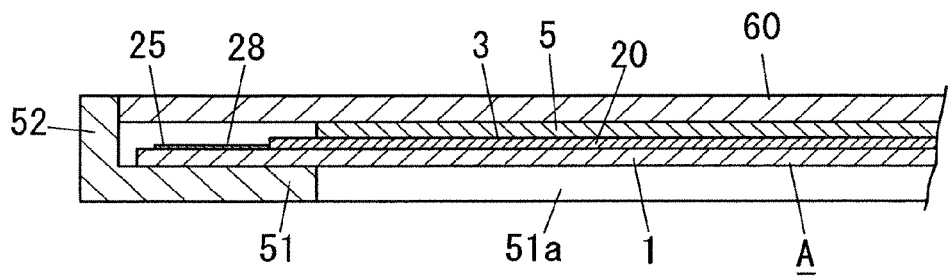
FIG. 14 is a schematic exploded perspective view of an essential part of lighting equipment using the planar light emitting device.

Here, an example of lighting equipment comprising the planar light emitting device A as a light source is described referring to FIGS. 13 and 14.

In the lighting equipment having the configuration shown in FIGS. 13 and 14, an equipment body is composed of a flat front case (a cover member) 50 formed with a storing recess for putting the planar light emitting device A on one surface in a thickness direction, and a rear panel 60 put in the storing recess of the front case 50 to cover the planar light emitting device A. A radiating member 5 is intervened between the planar light emitting device A and the rear panel 60 in order to radiate heat generated at the planar light emitting device A and to equalize heat of the light emitting part 20.

The front case 50 includes a peripheral wall 52 extended rearward from the outer circumferential edge of a front wall 51 of which circumferential shape is quadrilateral. The storing recess is formed of a space surrounded by the front wall 51 and the peripheral wall 52. A window bore 51a that is quadrilateral (rectangular in the illustration example) is formed at a central part of the front wall 51 to expose a part corresponding to the light emitting part 20 in the first surface of the transparent substrate 1 in the planar light emitting device A. Here, an aperture size of the window bore 51a in the front case 50 is set to prevent, from appearing, parts except the part corresponding to the light emitting part 20 in the transparent substrate 1 of the planar light emitting device A from the front side of the front case 50.

A cutout part 54 in which electric wires 61, 61, 63, 63 for power supply to the planar light emitting device A are put is formed at rear end of the peripheral wall 52 in the front case 50. One end sides of the electric wires 61, 61, 63, 63 are connected to the anode external electrodes E1, E1 and the cathode external electrodes E2, E2 of the planar light emitting device A, and the other ends are provided with a second connector 70 releasably connected to a first connector (not shown) for output of another power supply unit (not shown). Two anode external electrodes E1, E1 between which a cathode external electrode E2 intervenes are electrically connected through a forwarding wiring 62.

The front case 50 and the rear panel 60 are made of metal (e.g., Al, Cu, etc.) with high thermal conductivity in comparison with plastic from a point of view of protect of the planar light emitting device A and high radiation performance. The organic EL element 2 and the front case 50 are electrically insulated with the transparent substrate 1 formed of a glass substrate. What is needed is to appropriately employ, as the radiating member 5, a thing having thermal conduction property and electrical insulation property such as, for example, an epoxy resin sheet with highly-filled filler (e.g., an organic green sheet comprising an epoxy resin sheet with highly-filled molten silica), a ceramic sheet, a graphite sheet, and a rubber sheet for heat radiation. The organic EL element 2 and the rear panel 60 are, through the radiating member 5, thermally bonded and also electrically insulated. The depth dimensions of the storing recess in the front case 50 is set to the same value as the total dimension of the thickness dimension of the planar light emitting device A, the thickness dimension of the radiating member 5 and the thickness dimension of the rear panel 60.

It is assumed that the planar light emitting device A of the embodiment is used as a light source of the lighting equipment having the equipment body of a metal member composed of the metal front case 50 and the metal rear panel 60 as discussed previously. In the front case 50, the storing recess has an opening that is quadrilateral. The opening size of the storing recess is set to be slightly larger than a plane size of a planar light emitting device A in consideration of dispersion in plane sizes of planar light emitting devices A. However, the transparent substrate 1 of a planar light emitting device A may come in contact with the peripheral wall 52 of a front case 50 by position displacement of the planar light emitting device A or the like. Therefore, in the planar light emitting device A of the embodiment, the distance between the peripheral border of the transparent substrate 1 and the peripheral border of the anode external electrodes E1 and the cathode external electrodes E2 and transparent substrate 1 is set (to 0.2 mm in this case) so as to meet, in lighting equipment, the demand of creepage distance (electrical insulation distance) of the anode external electrodes E1 and the cathode external electrodes E2 from the front case 50 as a part of the equipment body (e.g., 0.2 mm or more). Accordingly, it is unnecessary to provide an insulating member for electric insulation between the front case 50 made of metal and the side edges of the planar light emitting device A (the side edges of the transparent substrate), thereby reducing cost.

Figure 15:
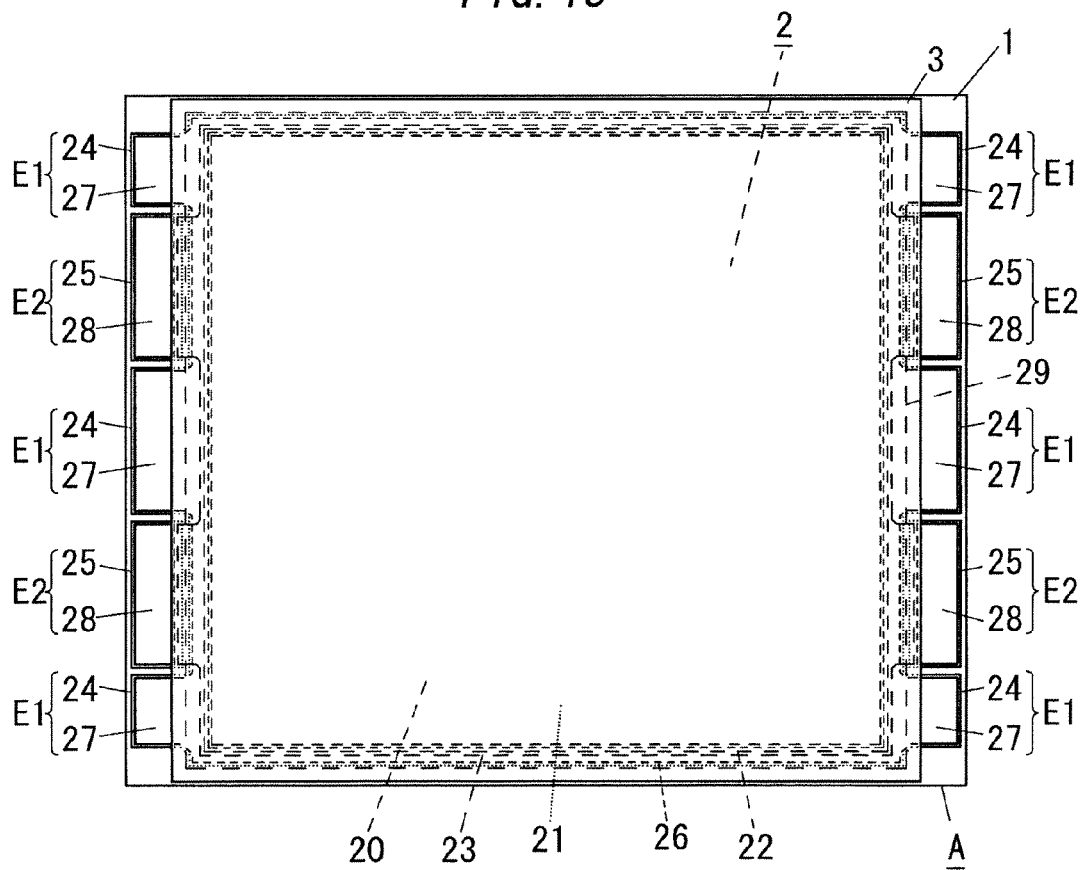
FIG. 15 is a back view of another configuration example of the planar light emitting device.

In order to enlarge the area of the light emitting part 20 in the planar light emitting device A having the configuration shown in FIG. 1 and to restrain increase of brightness dispersion by increase of the distance between anode external electrodes E1, it is preferable that, for example, as shown in FIG. 15, the numbers of anode external electrodes E1 and cathode external electrodes E2 is increased and the center-to-center dimension of two anode feeding parts 24, 24 located at both sides, in a width direction, of a cathode feeding part 25 is shortened. In the planar light emitting device A shown in FIG. 15, the plane size of the light emitting part 20 is set to 80 mm □. The center-to-center dimension of two anode feeding parts 24, 24 located at both sides, in a width direction, of a cathode feeding part 25 is set to 30 mm, but not limited to this. It may be appropriately set in a range of about 30 mm-60 mm.

Figure 16A:
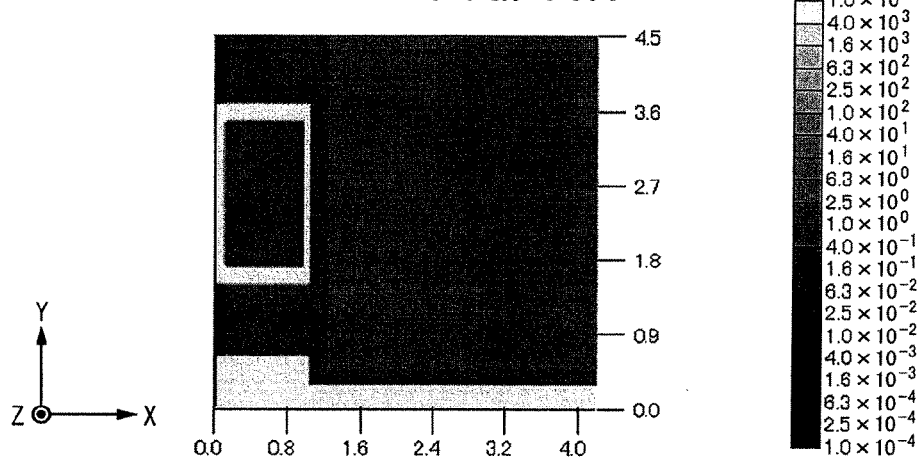
FIGS. 16A, 16B and 16C are a sheet resistance distribution map of an essential part, a brightness distribution map (a current density distribution map) of the essential part and an electric potential distribution map of the essential part, respectively.
Figure 16B:
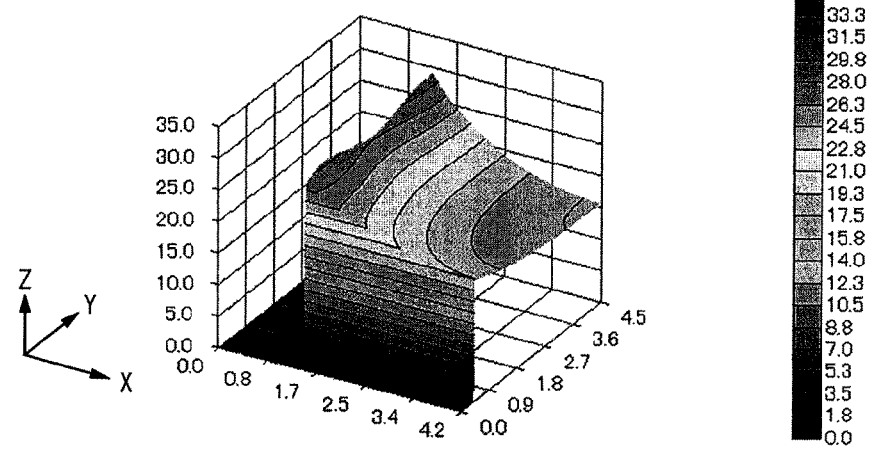
Figure 16C:
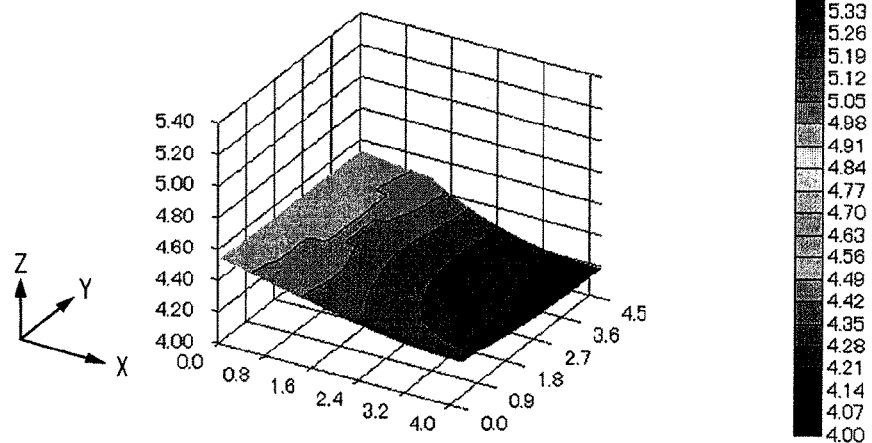
Figure 17A:
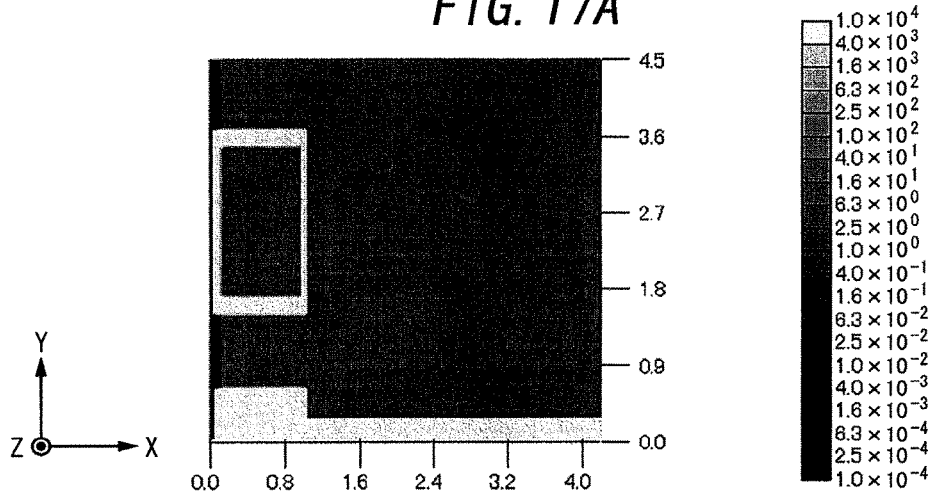
FIGS. 17A, 17B and 17C are a sheet resistance distribution map of an essential part, a brightness distribution map (a current density distribution map) of the essential part and an electric potential distribution map of the essential part, respectively.
Figure 17B:
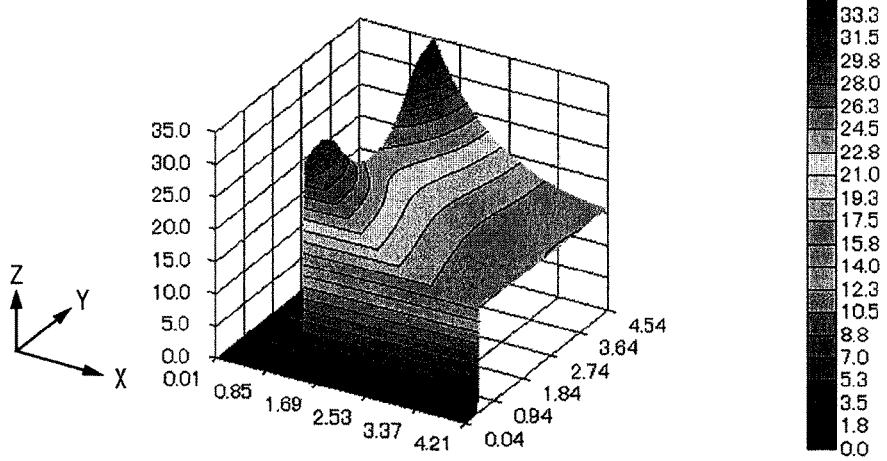
Figure 17C:
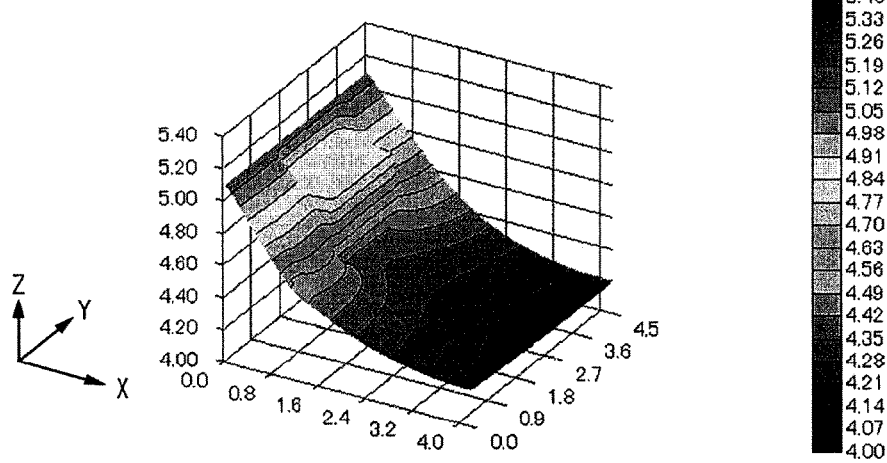
Figure 18A:
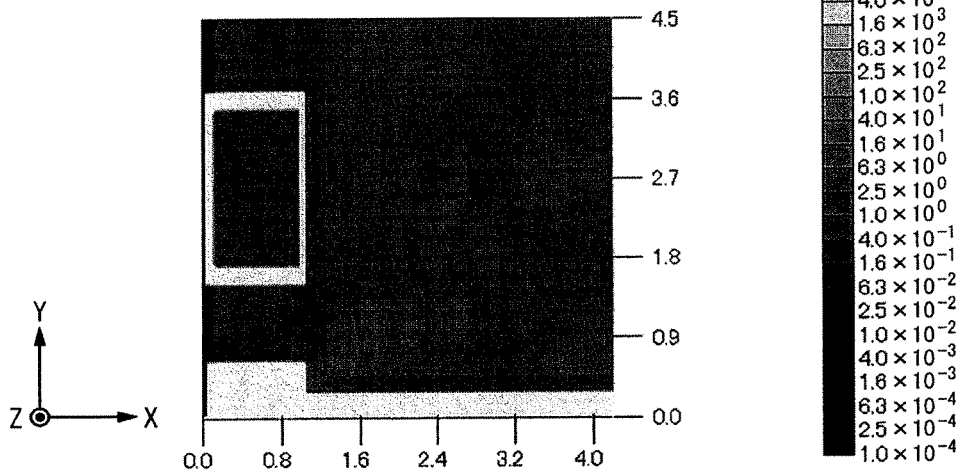
FIGS. 18A, 18B and 18C are a sheet resistance distribution map of an essential part, a brightness distribution map (a current density distribution map) of the essential part and an electric potential distribution map of the essential part, respectively.
Figure 18B:
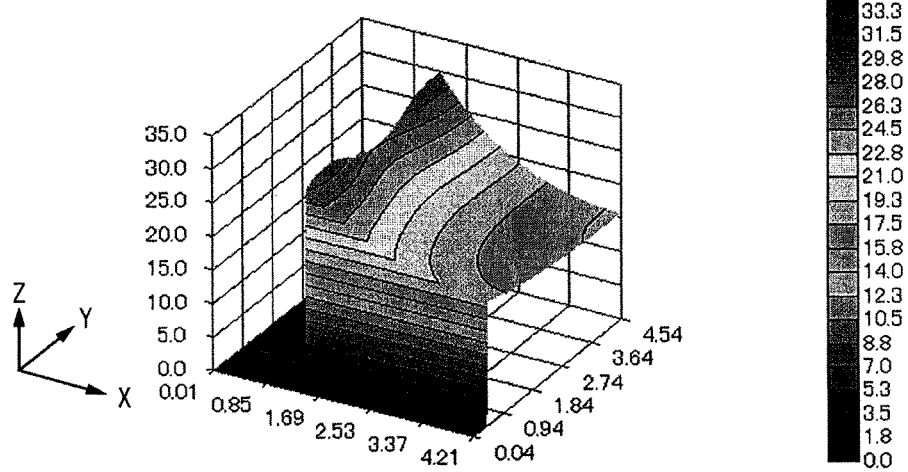
Figure 18C:
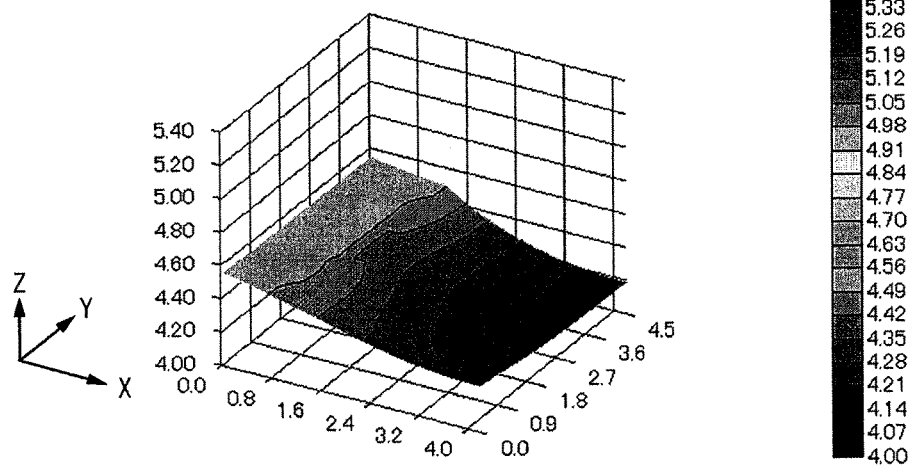
Figure 19A:
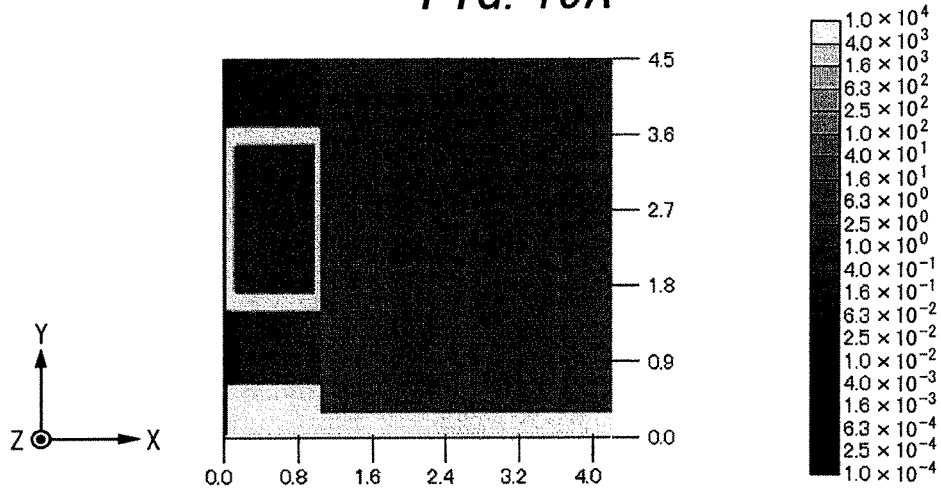
FIGS. 19A, 19B and 19C are a sheet resistance distribution map of an essential part, a brightness distribution map (a current density distribution map) of the essential part and an electric potential distribution map of the essential part, respectively.
Figure 19B:
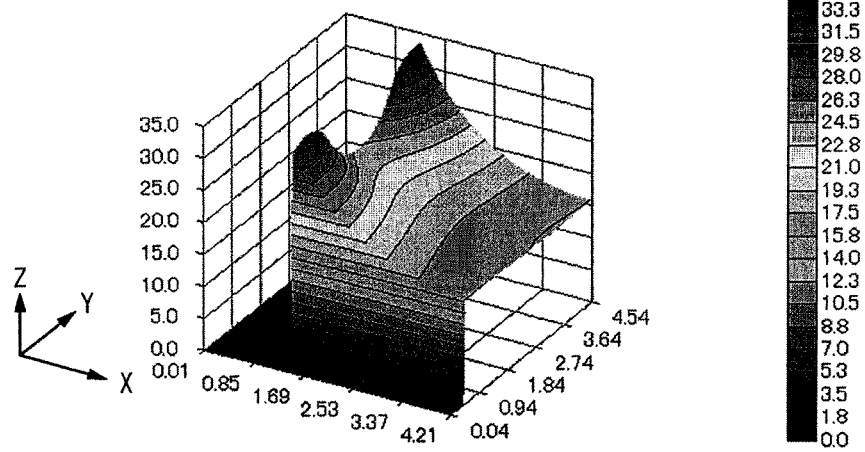
Figure 19C:
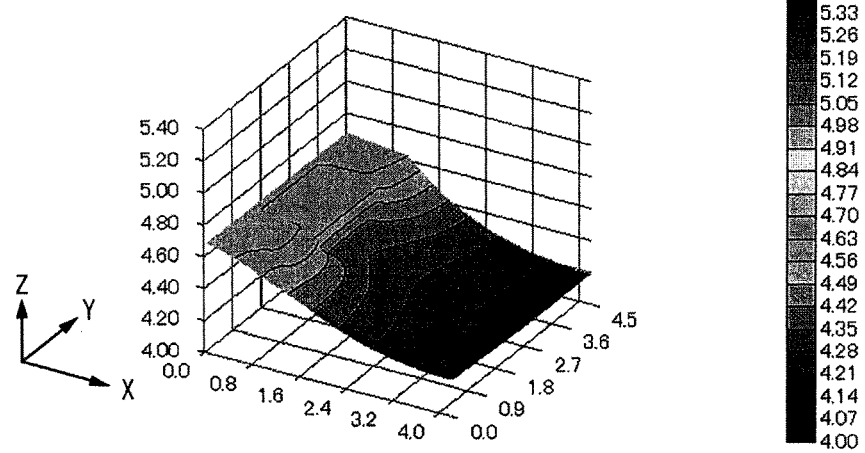
Figure 20A:
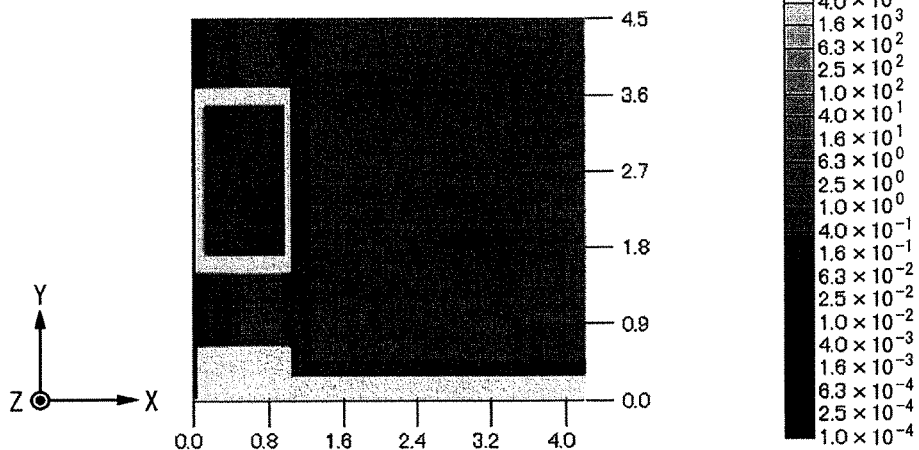
FIGS. 20A, 20B and 20C are a sheet resistance distribution map of an essential part, a brightness distribution map (a current density distribution map) of the essential part and an electric potential distribution map of the essential part, respectively.
Figure 20B:
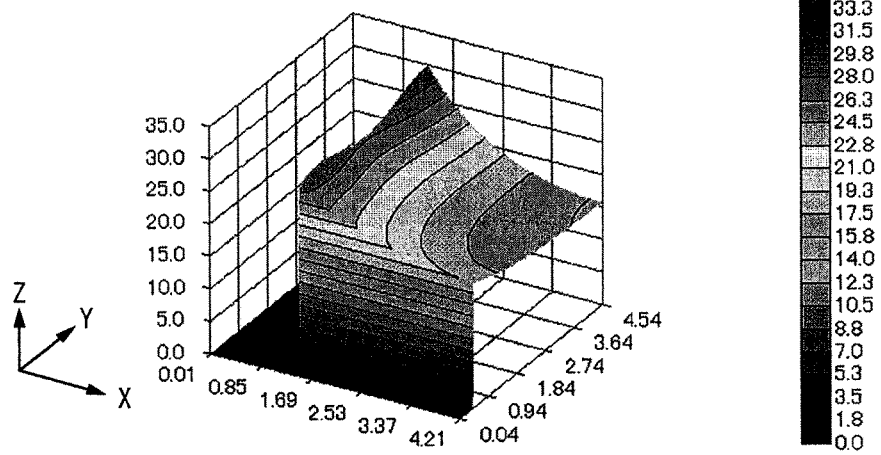
Figure 20C:
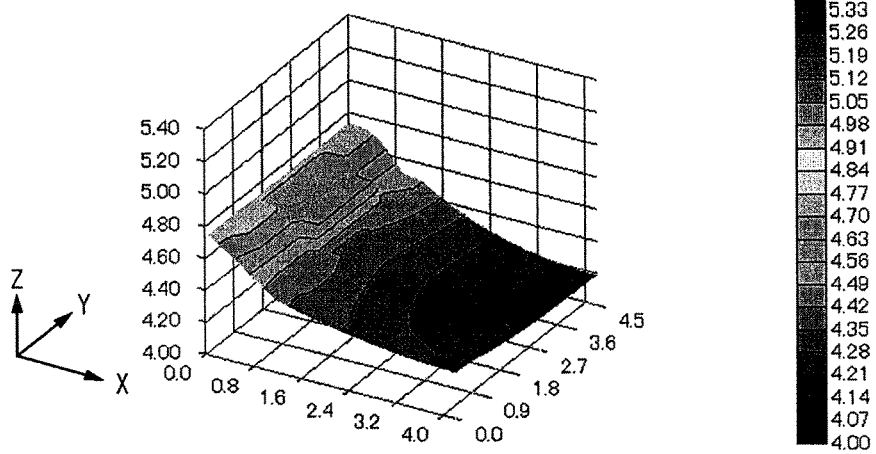
Figure 21A:
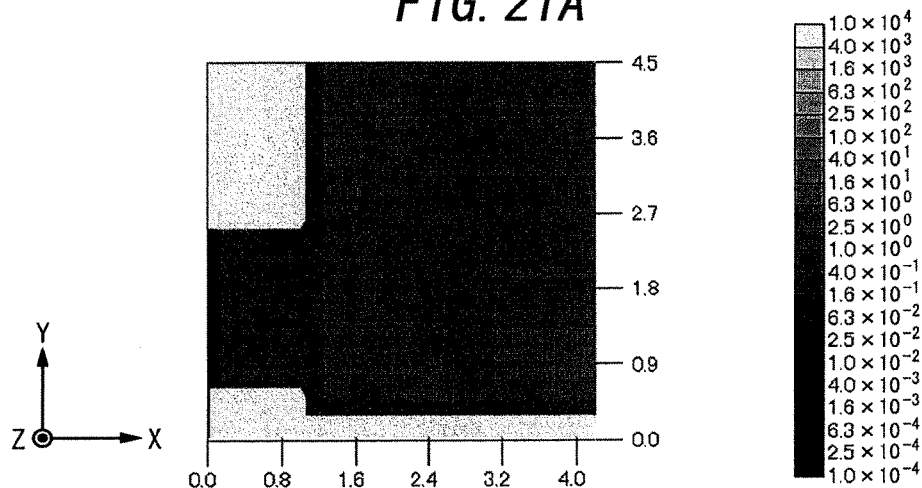
FIGS. 21A, 21B and 21C are a sheet resistance distribution map of an essential part, a brightness distribution map (a current density distribution map) of the essential part and an electric potential distribution map of the essential part, respectively.
Figure 21B:
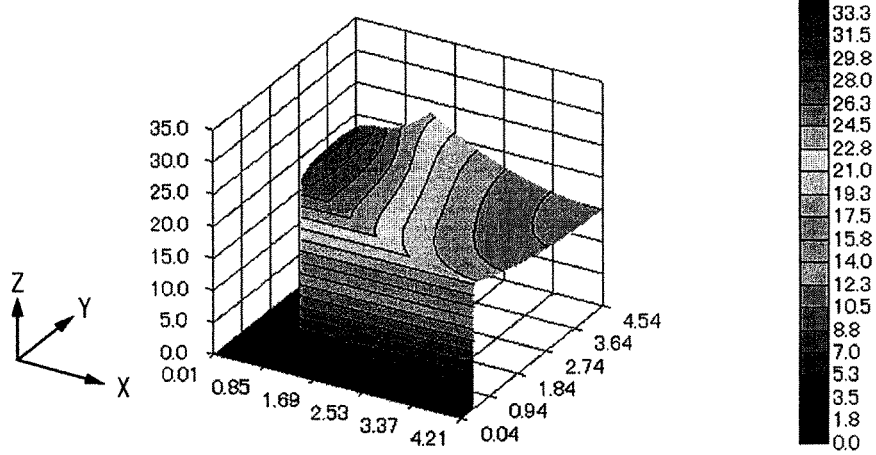
Figure 21C:
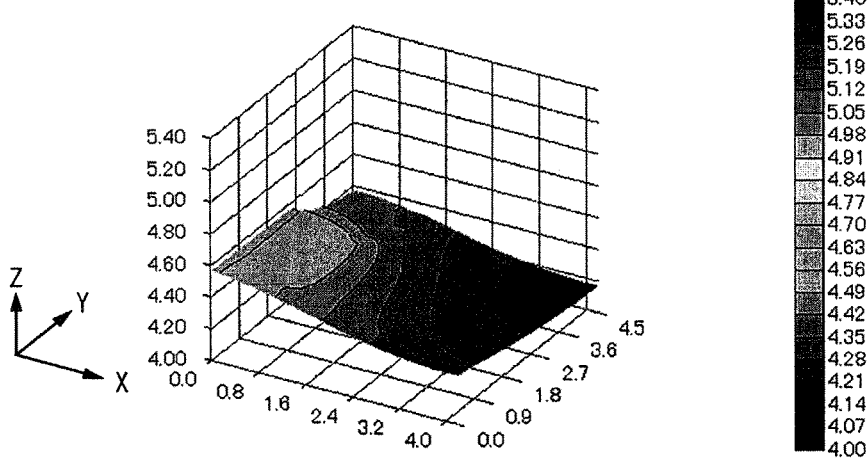

FIGS. 16A, 16B and 16C respectively show simulation results of sheet resistance distribution, brightness distribution (current density distribution) and electric potential distribution, regarding an essential part in a first practical example where the width of an auxiliary electrode 26 is 2 mm in the planar light emitting device A having the configuration shown in FIG. 15. Similar simulation results about a first comparative example where the auxiliary electrodes 26 and the auxiliary electrodes 27 are removed from the same configuration as the first practical example are shown in FIGS. 17A, 17B and 17C, respectively. Similar simulation results about a third practical example where the width of an auxiliary electrode 26 is 1.2 mm in the same configuration as the first practical example are shown in FIGS. 18A, 18B and 18C, respectively. Similar simulation results about a third comparative example where the auxiliary electrodes 26 are removed from the same configuration as the first practical example are shown in FIGS. 19A, 19B and 19C, respectively. Similar simulation results about a third practical example where, in the same configuration as the first practical example, an auxiliary electrode 27 is provided with a slit of which width is 5 mm and a part of an anode feeding part 24 formed of an ITO film of transparent conductive film is exposed are shown in FIGS. 20A, 20B and 20C, respectively. Similar simulation results about a third comparative example where, in the same configuration as the first practical example, the number of anode external electrode E1 is one and an anode external electrode E1 and a cathode external electrode E2 are located at both ends, in a lateral direction, of the transparent substrate 1 are shown in FIGS. 21A, 21B and 21C, respectively. Each A of FIGS. 16-21 shows in-plane distribution of sheet resistance in XY plane (unit: Ω/□) where the origin is a corner of the transparent substrate 1 in plan view, the x-axis direction is a longitudinal direction of the transparent substrate 1, the y-axis direction is a lateral direction of the transparent substrate 1, and the z-axis direction is a thickness direction of transparent substrate 1. Each B of FIGS. 16-21 shows in-plane distribution of current density, where the z-axis direction is current-density amplitude (unit: mA/cm$^2$) like FIG. 12. Each C shows electric potential distribution, where the z-axis direction is electric potential level (unit: V) of a planar anode 21 and a part electrically connected to the planar anode 21 in A.

TABLE 2 is a summary of each condition of the first practical example, the first comparative example, the second practical example, the second comparative example, the third practical example, and the third comparative example. TABLE 3 is a summary of the simulation results. In TABLE 3, Vp(max) shows maximum electric potential in the aforementioned electric potential distribution, Vp(min) shows minimum electric potential in the aforementioned electric potential distribution, ΔV shows potential difference between maximum electric potential Vp(max) and minimum electric potential Vp(min), J(max) shows maximum current density in the aforementioned in-plane distribution of current density, J(min) shows minimum current density in the aforementioned in-plane distribution of current density, and J(min)/J(max) shows the percentage of minimum current density J(min) to maximum current density J(max).

TABLE 2

| | Anode auxiliary electrode | Auxiliary electrode for anode feeding part | Number of anode feeding parts | Average current density [mA/cm$^2$] | Area of light emitting part [cm$^2$] |
|---|---|---|---|---|---|
| Practical example 1 | Available: width 2 mm | Available | 2 | 20 | 12.7 |
| Comparative example 1 | Unavailable | Unavailable | 2 | 20 | 12.7 |
| Practical example 2 | Available: width 1.2 mm | Available | 2 | 20 | 12.7 |
| Comparative example 2 | Unavailable | Available | 2 | 20 | 12.7 |
| Practical example 3 | Available: width 2 mm | Partly available | 2 | 20 | 12.7 |
| Comparative example 3 | Available: width 2 mm | Available | 1 | 20 | 12.7 |

TABLE 3

| | Vp(max) [V] | Vp(min) [V] | ΔV [V] | J(max) [mA/cm$^2$] | J(min) [mA/cm$^2$] | J(min)/J(max) [%] |
|---|---|---|---|---|---|---|
| Practical example 1 | 4.53 | 4.19 | 0.34 | 29.1 | 15.6 | 53.6 |
| Comparative example 1 | 5.09 | 4.19 | 0.90 | 34.9 | 15.7 | 45.0 |
| Practical example 2 | 4.54 | 4.19 | 0.35 | 29.9 | 15.6 | 52.2 |
| Comparative example 2 | 4.68 | 4.19 | 0.49 | 33.6 | 15.7 | 46.7 |
| Practical example 3 | 4.74 | 4.19 | 0.55 | 29.9 | 15.7 | 52.5 |
| Comparative example 3 | 4.57 | 4.17 | 0.40 | 30.5 | 15.0 | 49.2 |

From comparison between the first practical example and the first comparative example, it is found that the value of J(min)/J(max) in the first practical example provided with the auxiliary electrodes 26 and 27 becomes large in comparison with the first comparative example with no auxiliary electrodes 26 and 27, and in-plane dispersion of current density is reduced and in-plane dispersion of brightness is reduced. In addition, the value of Vp(max) in the first practical example becomes small in comparison with the first comparative example 1, and it is found that energy can be saved by reducing drive voltage.

From comparison between the first practical example and the second comparative example, it is found that the value of potential difference ΔV becomes small and the value of J(min)/J(max) becomes large, in the first practical example provided with the auxiliary electrodes 26 and 27 in comparison with the second comparative example with no auxiliary electrode 26, and in-plane dispersion of current density is reduced and in-plane dispersion of brightness is reduced. In brief, it is found that in-plane dispersion of brightness can be more reduced by providing the auxiliary electrodes 27 in addition to the auxiliary electrodes 26.

From comparison between the first practical example and the second practical example, it is found that there is little difference in each value of potential difference ΔV and J(min)/J(max) between the first practical example where the width of auxiliary electrode 26 is 2 mm and the second practical example where the width of auxiliary electrode 26 is 1.2 mm, and it is very important to comprise an auxiliary electrode 26 in order to reduce brightness uniformity.

From comparison between the first practical example and the third practical example, it is found that there is little difference in J(min)/J(max) value and brightness uniformity between the first practical example where the surface of an anode feeding part 24 is completely covered by an auxiliary electrode 27 and the second practical example where a part of the surface of an anode feeding part 24 is exposed though a slit that is 5 mm in width and formed in an auxiliary electrode 27, but potential difference ΔV in the first practical example becomes small in comparison with the second practical example, and it is important to comprise an auxiliary electrode 27.

From comparison between the first practical example and the third comparative example, it is found that, in the third comparative example where, in the same configuration as the first practical example, the number of anode external electrodes E1 is one and an anode external electrode E1 and a cathode external electrode E2 are located at both ends, in a lateral direction, of the transparent substrate 1, potential difference ΔV has little change in comparison with the first practical example but J(min)/J(max) value becomes large in comparison with the first practical example, and accordingly it is effective to provide a plurality of anode external electrodes E1 to intervene a cathode external electrode E2 therebetween in order to reduce brightness uniformity.

The planar light emitting device A of the embodiment comprises: an auxiliary electrode 26 that is quadrilateral (square in the illustration example) and is formed at whole circumference of opposite surface of the transparent substrate 1 side in the planar anode 21 to be electrically connected to the planar anode 21; and an auxiliary electrode 27 that is integrally and continuously formed with the auxiliary electrode 26 to be layered on the anode feeding part 24. Accordingly, it is possible to reduce brightness uniformity caused by potential gradient of the planar anode 21 comprising a transparent conductive film. The light emitting part 20 is formed of the region where the only organic layer 22 intervenes between the planar anode 21 and the planar cathode 23, and has a plane shape that is quadrilateral (square in the illustration example), wherein two distances D1, D2 between predetermined two parallel sides of the quadrilateral four sides of the light emitting part 20 (two sides 2a, 2b (see, FIG. 1A) along a longitudinal direction of the transparent substrate 1 in the examples of FIGS. 1 and 15) and the outer circumferential edges 1a, 1b of the transparent substrate 1 on sides adjacent to the two parallel sides 2a, 2b, respectively, becomes small in comparison with two distances D3, D4 between the other two parallel sides (two sides 2c, 2d (see, FIG. 1A) in a lateral direction of the transparent substrate 1 in the examples of FIGS. 1 and 15) and the outer circumferential edges 1c, 1d of the transparent substrate 1 on sides adjacent to the other two parallel sides 2c, 2d, respectively. The cathode feeding parts 25 and the anode feeding parts 24 are arranged along the aforementioned other parallel two sides of the light emitting part 20 in plan view. Anode feeding parts 24 are arranged at both sides, in a width direction, of a cathode feeding parts 25, respectively. Accordingly, it is possible to reduce brightness uniformity and area of the non-light emitting part 20 to improve design. Thus, in the lighting equipment using arrayed planar light emitting devices A of the embodiment, it is possible to reduce the distance between adjacent light emitting parts 20 to improve appearance. In the planar light emitting device A of the embodiment, anode feeding parts 24 are arranged at both sides, in a width direction, of a cathode feeding part 25, respectively, thereby reducing drive voltage to save energy.

In plan view, the transparent substrate 1 may be quadrilateral or square, and therefore is not limited to be rectangular. In this instance, the light emitting part 20 has a plane shape that is rectangular, and the aforementioned predetermined two sides are two lateral sides in the rectangular light emitting part 20. In plan view, the transparent substrate 1 may be rectangular and the light emitting part 20 may be rectangular that is not similar to the transparent substrate 1, wherein the aforementioned predetermined two sides may be two longitudinal sides in the rectangular light emitting part 20.

In the planar light emitting device A of the embodiment, chamfers 167 are formed between each side edge, in a width direction, of an auxiliary electrode 27 and an outer circumferential edge of the auxiliary electrode 26 (see FIG. 6). Accordingly, it is possible to reduce electric field concentration and brightness uniformity in comparison with the case that no chamfer 167 is formed. The planar light emitting device A of the embodiment is provided with wirings 23b which are integrally and continuously extended from the planar cathode 23 to electrically connect between the planar cathode 23 and the cathode feeding parts 25. Chamfers 135 are formed between each side edge, in a width direction, of a wiring 23b and an outer circumferential edge of the planar cathode 23 (see FIG. 9). Accordingly, it is possible to reduce electric field concentration and brightness uniformity in comparison with the case that no chamfer 135 is formed. Each of the chamfers 167 and 135 is a C-chamfer in a linear fashion in plan view, but not limited to this, which may be an R-chamfer in the shape of an arc in plan view.

If chamfers (not shown) are formed between adjacent inner side edges of the auxiliary electrode 26, it is possible to reduce electric field concentration in corners of the auxiliary electrode 26, to prevent brightness from becoming higher locally due to electric current excessive locally, to reduce brightness uniformity and to prevent burn-in and life shortening. Similarly, if chamfers are formed between adjacent outer edges of the anode auxiliary electrode, it is possible to reduce electric field concentration in corners of the auxiliary electrode 26, to prevent an excessive electric current from flowing locally, to reduce brightness uniformity and to prevent life shortening. The chamfers formed in the auxiliary electrode 26 may be C or R chamfers.

Second Embodiment

Figure 22:
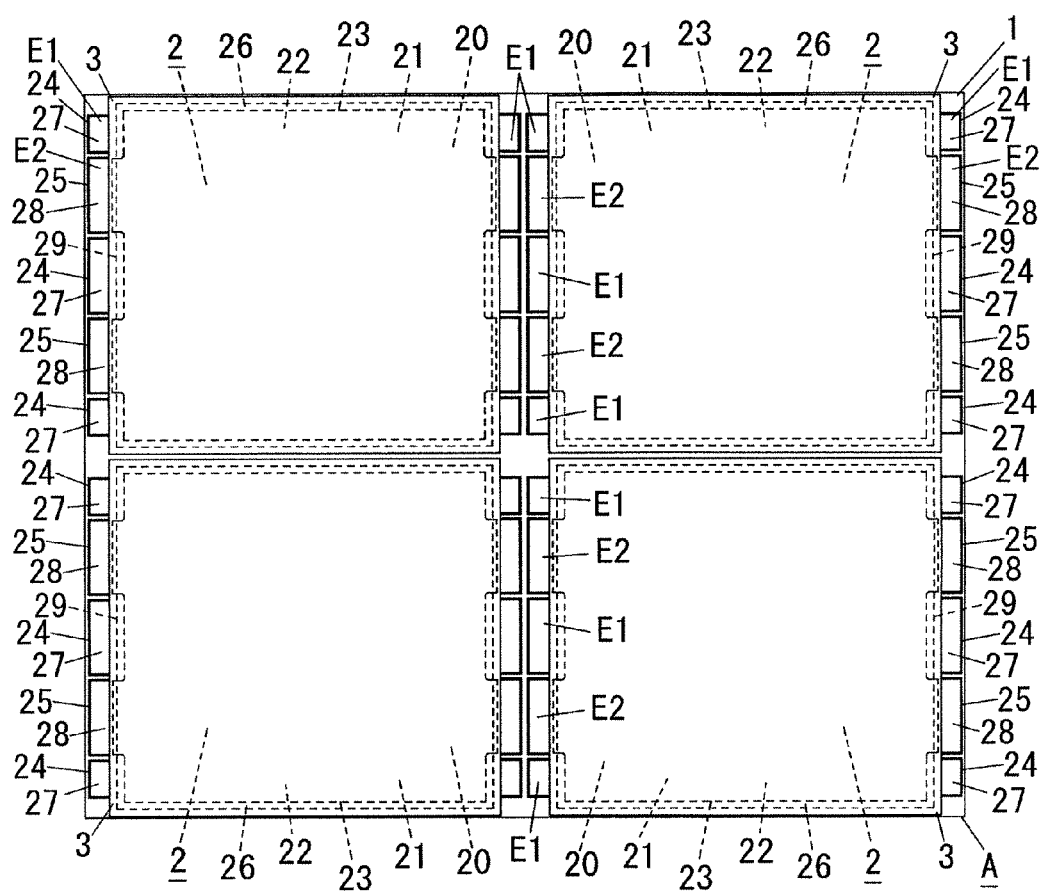
FIG. 22 shows a back view of a planar light emitting device of a second embodiment.

The basic structure of a planar light emitting device A in the present embodiment shown in FIG. 22 is the generally same as the first embodiment, and differs in that a plane size of the transparent substrate 1 is generally 4 times of the transparent substrate 1 in the planar light emitting device A shown in FIG. 15 and four organic EL elements 2 are arranged on the transparent substrate 1 to form a two-dimensional array. Note that like kind elements are assigned the same reference numerals as depicted in the first embodiment and explanation is omitted.

In the planar light emitting device A of the embodiment, it is possible to enlarge the area of the planar light emitting device A in comparison with the planar light emitting device A of the first embodiment (the area of the light emitting part 20 a transparent substrate 1 is increased). Moreover, it is possible to shorten the distance between light emitting parts 20 of adjacent organic EL elements 2 in a vertical direction of FIG. 22. Therefore, a non-light emitting part between adjacent light emitting parts 20 can be decreased and design can be improved.

Although the present invention has been described with reference to certain preferred embodiments, numerous modifications and variations can be made by those skilled in the art without departing from the true spirit and scope of this invention, namely claims.

The invention claimed is:
1. A planar light emitting device, comprising:
a transparent substrate that is quadrilateral in plan view; and
an organic EL element formed on a first surface side of the transparent substrate,
wherein the organic EL element comprises:
a single planar anode comprising a transparent conductive film formed on the first surface side of the transparent substrate, said anode being quadrilateral in plan view;
an organic layer which is formed on the opposite side of the planer anode from the transparent substrate and comprises at least a light emitting layer, said organic layer being quadrilateral in plan view;
a single planar cathode which is formed on the opposite side of the single planar anode in the organic layer and is opposed to the single planar anode, said cathode being quadrilateral in plan view;
an anode feeding part which is formed on the first surface side of he transparent substrate and electrically connected to the single planar anode;

a cathode feeding part which is formed on the first surface side of the transparent substrate and electrically connected to the single planar cathode;

an anode auxiliary electrode which is formed at the whole circumference of the opposite surface of the single planar anode from the transparent substrate and electrically connected to the single planar anode, said anode auxiliary electrode being in the shape of a quadrilateral frame; and an anode feeding auxiliary electrode which is integrally and continuously formed to the anode auxiliary electrode and laminated on the anode feeding part, wherein a light emitting part is formed of a region where the light emitting layer intervenes between the single planar anode and the single planar cathode, the plane shape of the light emitting part being quadrilateral, two distances between predetermined two parallel sides of the four sides of the light emitting part and outer circumferential edges of the transparent substrate on sides adjacent to the two parallel sides, respectively being smaller than two distances between the other two parallel sides and the outer circumferential edges of the transparent substrate on sides adjacent to the other two parallel sides, respectively.

2. The planar light emitting device of claim 1, comprising a cathode feeding auxiliary electrode which is laminated on the cathode feeding part and electrically connected to the cathode feeding part.

3. The planar light emitting device of claim 2,
wherein the anode feeding part and the cathode feeding part are the same in thickness and formed of the same material,
wherein the anode feeding auxiliary electrode and the cathode feeding auxiliary electrode are the same in thickness and formed of the same material, and
wherein an overall width of an anode external electrode composed of the anode feeding part and the anode feeding auxiliary electrode and an overall width of a cathode external electrode composed of the cathode feeding part and the cathode feeding auxiliary electrode are set to the same value.

4. The planar light emitting device of claim 2, comprising chamfers formed between each side edge, in a width direction, of the anode feeding auxiliary electrode and the outer circumferential edge of the anode auxiliary electrode.

5. The planar light emitting device of claim 2, comprising:
a wiring which is integrally and continuously extended from the single planar cathode to electrically connect between the single planar cathode and the cathode feeding part; and
chamfers formed between each side edge, in a width direction, of the wiring and the outer circumferential edge of the single planar cathode.

6. The planar light emitting device of claim 2, comprising chamfers formed between adjacent inner side edges of the anode auxiliary electrode.

7. The planar light emitting device of claim 2, comprising a sealing member fixed to said first surface side of the transparent substrate by nonconductive adhesive comprising sealing material so as to cover the light emitting part of the organic EL element,
the sealing member comprising a metal foil.

8. The planar light emitting device of claim 1, comprising chamfers formed between each side edge, in a width direction, of the anode feeding auxiliary electrode and the outer circumferential edge of the anode auxiliary electrode.

9. The planar light emitting device of claim 1, comprising:
a wiring which is integrally and continuously extended from the single planar cathode to electrically connect between the single planar cathode and the cathode feeding part; and
chamfers formed between each side edge, in a width direction, of the wiring and the outer circumferential edge of the single planar cathode.

10. The planar light emitting device of claim 1, comprising chamfers formed between adjacent inner side edges of the anode auxiliary electrode.

11. The planar light emitting device of claim 1, comprising a sealing member fixed to said first surface side of the transparent substrate by nonconductive adhesive comprising sealing material so as to cover the light emitting part of the organic EL element,
the sealing member comprising a metal foil.

12. The planar light emitting device of claim 11, comprising a chamfer formed between a side edge and the surface of the transparent substrate side in the metal foil.

13. The planar light emitting device of claim 11, wherein the sealing material contains spherical fillers 20 µm or more in grain diameter.

14. The planar light emitting device of claim 11, comprising a black oxidation surface formed on the opposite surface side of the transparent substrate in the metal foil.

15. The planar light emitting device of claim 11, comprising a thermal radiation layer which is fixed to the opposite surface side of the transparent substrate in the metal foil and formed of material with higher emissivity than the metal foil.

16. The planar light emitting device of claim 12, wherein the sealing material contains spherical fillers 20 µm or more in grain diameter.

17. The planar light emitting device of claim 12, comprising a black oxidation surface formed on the opposite surface side of the transparent substrate in the metal foil.

18. The planar light emitting device of claim 12, comprising a thermal radiation layer which is fixed to the opposite surface side of the transparent substrate in the metal foil and formed of material with higher emissivity than the metal foil.

19. The planar light emitting device of claim 3, comprising chamfers formed between each side edge, in a width direction, of the anode feeding auxiliary electrode and the outer circumferential edge of the anode auxiliary electrode.

20. The planar light emitting device of claim 3, comprising:
a wiring which is integrally and continuously extended from the single planar cathode to electrically connect between the single planar cathode and the cathode feeding part; and
chamfers formed between each side edge, in a width direction, of the wiring and the outer circumferential edge of the single planar cathode.

21. The planar light emitting device of claim 1, wherein the cathode feeding part and the anode feeding part are located along said other two parallel sides of the light emitting part in plan view.

22. The planar light emitting device of claim 1, wherein a light-emitting region which the light emitting part comprises includes no insulating layer.

* * * * *